(12) United States Patent
Yuzurihara et al.

(10) Patent No.: US 10,886,850 B2
(45) Date of Patent: Jan. 5, 2021

(54) POWER SUPPLY DEVICE AND METHOD FOR CONTROLLING POWER SUPPLY DEVICE

(71) Applicant: KYOSAN ELECTRIC MFG. CO., LTD., Yokohama (JP)

(72) Inventors: Itsuo Yuzurihara, Yokohama (JP); Ryosuke Ohma, Yokohama (JP); Hiroshi Kunitama, Yokohama (JP); Yu Hosoyamada, Yokohama (JP)

(73) Assignee: KYOSAN ELECTRIC MFG. CO., LTD., Yokohama (JP)

( * ) Notice: Subject to any disclaimer, the term of this patent is extended or adjusted under 35 U.S.C. 154(b) by 0 days.

(21) Appl. No.: 16/473,373

(22) PCT Filed: Feb. 23, 2017

(86) PCT No.: PCT/JP2017/006748
§ 371 (c)(1),
(2) Date: Jun. 25, 2019

(87) PCT Pub. No.: WO2018/123082
PCT Pub. Date: Jul. 5, 2018

(65) Prior Publication Data
US 2020/0144920 A1 May 7, 2020

(30) Foreign Application Priority Data
Dec. 27, 2016 (JP) .................................. 2016-254307

(51) Int. Cl.
*H02M 3/158* (2006.01)
*H02M 3/157* (2006.01)
(Continued)

(52) U.S. Cl.
CPC ......... *H02M 3/1584* (2013.01); *H01J 37/241* (2013.01); *H01J 37/32027* (2013.01); *H01J 37/32082* (2013.01); *H02M 3/157* (2013.01)

(58) Field of Classification Search
CPC .... H02M 3/1584; H02M 3/157; H01J 37/241; H01J 37/32027; H01J 37/32082
See application file for complete search history.

(56) References Cited

U.S. PATENT DOCUMENTS

2006/0212138 A1   9/2006 Zhang
2009/0267580 A1*  10/2009 Derksen ................ H02M 3/157
                                              323/282

(Continued)

FOREIGN PATENT DOCUMENTS

JP    2004-289887 A    10/2004
JP    2006-204048 A    8/2006
(Continued)

OTHER PUBLICATIONS

International Search Report dated Apr. 25, 2017, issued in counterpart International Application No. PCT/JP2017/006748, with English Translation (5 pages).

(Continued)

*Primary Examiner* — Thienvu V Tran
*Assistant Examiner* — Bart Iliya
(74) *Attorney, Agent, or Firm* — Westerman, Hattori, Daniels & Adrian, LLP

(57) ABSTRACT

Multi-phase interleaving control of a power supply device is accelerated. Furthermore, in accelerating the multi-phase interleaving control in the power supply device, detection of feedback signal is accelerated. In the power supply device and a method for controlling the power supply device, output voltage is acquired as an operation result of a discrete time process using an initial value of the output voltage at a (Continued)

predetermined point, and a detection value of capacitance current at each point of the discrete time process. Accordingly, only detection of the initial value is performed when the output voltage being slow in response is acquired, and detection performed in the discrete time process can be accomplished by detection of capacitance current being rapid in response, thus enabling rapid response.

4 Claims, 19 Drawing Sheets

(51) Int. Cl.
*H01J 37/24* (2006.01)
*H01J 37/32* (2006.01)

(56) References Cited

U.S. PATENT DOCUMENTS

| | | | |
|---|---|---|---|
| 2010/0002477 A1 | 1/2010 | Hasegawa et al. | |
| 2011/0096571 A1 | 4/2011 | Usuda et al. | |
| 2011/0298439 A1 | 12/2011 | Ng et al. | |
| 2012/0256571 A1* | 10/2012 | Ang | H02M 3/1584 318/400.3 |
| 2012/0275201 A1* | 11/2012 | Koyama | H02M 7/48 363/40 |
| 2014/0210442 A1 | 7/2014 | Umetani | |
| 2016/0204698 A1 | 7/2016 | Yuzurihara et al. | |
| 2017/0063239 A1* | 3/2017 | Wu | G06F 1/26 |
| 2019/0319535 A1* | 10/2019 | Yuzurihara | H02M 1/088 |

FOREIGN PATENT DOCUMENTS

| | | |
|---|---|---|
| JP | 2010-119285 A | 5/2010 |
| JP | 2011-259686 A | 12/2011 |
| JP | 2014-60851 A | 4/2014 |
| JP | 5704772 A | 4/2015 |
| JP | 2015-177636 A | 10/2015 |
| JP | 2015-220976 A | 12/2015 |
| JP | 2016-163402 A | 9/2016 |

OTHER PUBLICATIONS

Written Opinion of the International Searching Authority (Form PCT/ISA/237) dated Apr. 25, 2017, issued in counterpart International Application No. PCT/JP2017/006748, with English Translation (7 pages).
Office Action dated Sep. 3, 2020, issued in counterpart CN Application No. 201780081276.9, with English Translation. (11 pages).
Office Action dated Aug. 6, 2020, issued in counterpart TW Application No. 106110348, with English Translation. (10 pages).
Decision to Grant a Patent dated Jul. 21, 2020, issued in counterpart JP Application No. 2016-254307, with English Translation. (6 pages).
Office Action dated Jun. 24, 2020, issued in counterpart IN Application No. 201917027308, with English Translation. (6 pages).
Extended (Supplementary) European Search Report dated Jul. 10, 2020, issued in counterpart EP Application No. 17887124.0. (11 pages).
Milan Ilic et al.: "Digital Average Current-Mode Controller for DC-DC Converters in Physical Vapor Deposition Applications", IEEE Transactions on Power Electronics, Institute of Electrical and Electronics Engineers, USA, vol. 23, No. 3, May 1, 2008, pp. 1428-1436; Cited in Extended European Search Report dated Jul. 10, 2020. (9 pages).
M. del Viejo et al.: "V2IC Control: A Novel Control Technique with Very Fast Response Under Load and Voltage Steps", Applied Power Electronics Conference and Exposition (APEC), 2011 Twenty-Sixth Annual IEEE, IEEE, Mar. 6, 2011 (Mar. 6, 2011), pp. 231-237; Cited in Extended European Search Report dated Jul. 10, 2020. (7 pages).
Jorge Cortes et al.: "Limits of the frequency response for the analysis of ripple-based controllers", Applied Power Electronics Conference and Exposition (APEC), 2013 Twenty-Eighth Annual IEEE, IEEE, Mar. 17, 2013, pp. 2698-2705; Cited in Extended European Search Report dated Jul. 10, 2020. (8 pages).
Seiya Mizushima et al.: "DC Converter Control Using Deadbeat Control of High Switching Frequency for Two-Type Operation Modes", ECON 2014—40th Annual Conference of the IEEE Industrial Electronics Society, IEEE, Oct. 29, 2014, pp. 5029-5034; Cited in Extended European Search Report dated Jul. 10, 2020. (6 pages).
P. M. Cheng et al.: "Design of envelope amplifier based on interleaved multiphase buck converter with minimum time control for RF application", Energy Conversion Congress and Exposition (ECCE). 2011 IEEE, IEEE, Sep. 17, 2011, pp. 1279-1283; Cited in Extended European Search Report dated Jul. 10, 2020. (5 pages).

* cited by examiner

THREE-PHASE INTERLEAVING TWO-WAY STEP-DOWN CHOPPER
CIRCUIT

CURRENT-SOURCE LCR CIRCUIT u1($\tau$)=Vin when Q1 is ON and D1 is OFF,
u1($\tau$)=0 when Q1 is OFF and D1 is ON $$u_1(\tau) - v_o = L\frac{di_{L1}}{dt}$$

$$-v_o = L\frac{di_{L2}}{dt} = L\frac{di_{L3}}{dt}$$

$$i_{L1} + i_{L2} + i_{L3} - \frac{v_o}{R} = C\frac{dv_o}{dt}$$

EQUIVALENT CIRCUIT FOR u1($\tau$)

FIRST ORDER TRANSFER FUNCTION OF CONSTANT VOLTAGE
CONTROL

SECOND ORDER TRANSFER FUNCTION OF CONSTANT VOLTAGE
CONTROL

FIG.15

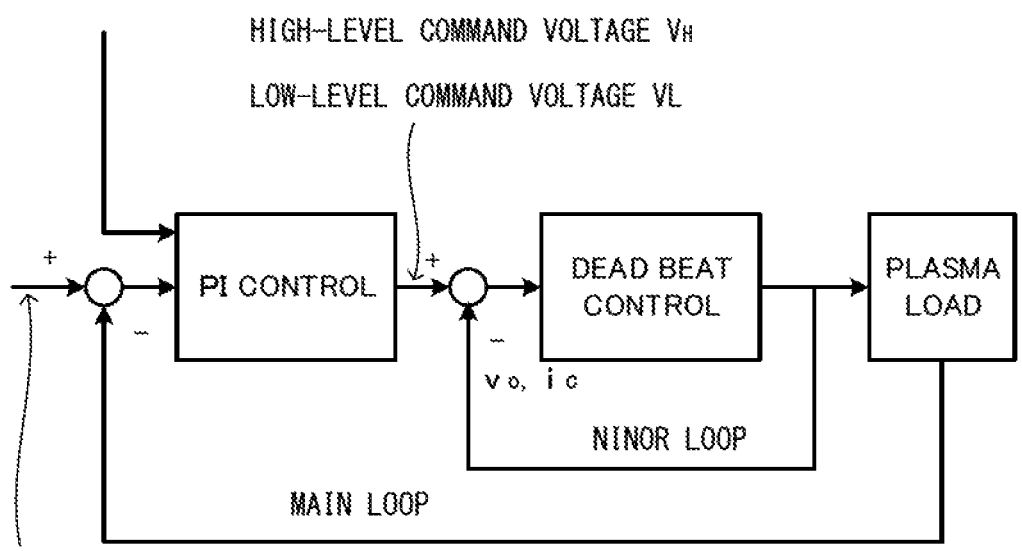

RATED DC CURRENT $I_{o\text{-}rat}$
RATED FORWARD WAVE POWER $P_{H\text{-}rat}$
RATED DC VOLTAGE $V_{o\text{-}rat}$

HIGH-LEVEL COMMAND VOLTAGE $V_H$
LOW-LEVEL COMMAND VOLTAGE $V_L$

HIGH-LEVEL FORWARD WAVE POWER COMMAND $P_{H\text{-}Forward}$

HIGH-LEVEL LOAD POWER COMMAND $P_{H\text{-}Load}$

LOW-LEVEL FORWARD WAVE POWER COMMAND $P_{L\text{-}Forward}$

LOW-LEVEL LOAD POWER COMMAND $P_{L\text{-}Load}$

VOLTAGE SOURCE LCR CIRCUIT

POWER SUPPLY DEVICE AND METHOD FOR CONTROLLING POWER SUPPLY DEVICE

TECHNICAL FIELD

The present invention relates to a power supply device and a method for controlling the power supply device.

BACKGROUND ART

With a proliferation of denser and more precise thin films generated by a process such as asking and etching, manufacturing equipment such as semiconductor manufacturing equipment and flat-panel manufacturing equipment are demanded to have a function for supplying pulse-state RF power to a plasma load. In particular, it is being demanded to perform two-level pulse power control, i.e., wideband High/Low pulse power operation with a system where RF power is continuously variable, switched between "Low power" being minimum power that keeps plasma from being extinguished and "High power" that is required for generating thin films.

A frequency band required by the High/Low pulse power operation is from 1 Hz to 50 kHz, for example. There are known some power supply devices for providing RF power, which employ class-A to class-E amplifiers using PI control. However, with the PI control, it is impossible to achieve the two-level pulse power control covering the wideband of several to tens of kHz.

Under these circumstances, a power supply used in a field of RF power sources for equipment is demanded to have capability of two-level pulse power control that performs wideband High/Low pulse power control.

As power supplies promising rapid response, a power supply employing an interleaving system is provided, and for example, there are known the arts as described in the following patent documents 1 to 3.

In the patent document 1, there is described that an interleaving-control power supply device is provided for performing power factor correction (PFC), including a master converter and a slave converter, for operating a switching element in the master converter and a switching element in the slave converter, with a predetermined phase difference, and interleaved voltage control is performed based on the output voltage being fed back.

In the patent document 2, there is described that a step-up chopper circuit comprises an interleaving circuit of multi-phase control type with n phases at least two, where a main switch performs switching operations with a predetermined phase difference mutually, and interleaving control is performed based on the output voltage being fed back.

In the patent document 3, there is described to solve a problem of current imbalance between phases, occurring in a converter with multi-phase interleaving system, and thereby protecting power elements, and interleaved current control is performed based on phase current values of sub-circuits provided for respective phases.

PRIOR ART DOCUMENT

Patent Document

Patent Document 1
Japanese Unexamined Patent Application Publication No. 2010-119285
Patent Document 2
Japanese Unexamined Patent Application Publication No. 2015-177636
Patent Document 3
Japanese Unexamined Patent Application Publication No. 2015-220976
Patent Document 4
Japanese Patent No. 5704772

DISCLOSURE OF THE INVENTION

Problems to be Solved by the Invention

It can be considered to apply multi-phase interleaving to a power supply device to provide wideband pulse power control. The interleaving control disclosed in the aforementioned patent documents 1 and 2 is a control system where voltage is controlled based on the output voltage being fed back, and the patent document 3 discloses a control system where current is controlled based on the phase current values of the respective phases. In those disclosed arts, there are problems as the following.

The interleaving control disclosed in the patent documents 1 and 2 is constant voltage control that is performed based on the feedback of output voltage vo, and thus there is a problem that secondary oscillating voltage may occur in a step response, causing overshoot or undershoot of the output voltage. In order to prevent such overshoot and undershoot, it is necessary to provide a setting of a low-speed control response, thus failing to address a rapid response.

FIG. 19 shows an equivalent circuit of an LCR circuit, illustrating the constant voltage control for feeding back the output voltage vo. This figure illustrates an example of the power supply device that includes a step-down chopper circuit comprising the LCR circuit.

In the LCR circuit as shown in FIG. 19, the output voltage vo given by the step response is expressed by the following formula, where the input voltage is U:

$$v_O(s) = \frac{\frac{R}{1+sCR}}{sL/3 + \frac{R}{1+sCR}} \frac{U}{s} = \frac{\frac{3}{LC}}{s^2 + \frac{1}{CR}s + \frac{3}{LC}} \frac{U}{s} = \frac{\omega_n^2}{s^2 + 2\varsigma\omega_n s + \omega_n^2} \frac{U}{s} \tag{1}$$

The formula 1 above indicates that the output voltage vo is secondary oscillating voltage, and also indicates occurrence of overshoot or undershoot.

The interleaving control described in the patent document 3 is current control performed based on the phase current values of respective phases. Therefore, there is a problem that more than one detector is required to detect the respective phase values, and further there is another problem that this may give rise to complexity in control.

In wideband pulse power control according to multi-phase interleaving, it is demanded to perform switching operation per phase rapidly. In order to perform the switching operation rapidly, it is necessary to increase a switching frequency. For this purpose, in a control system for performing pulse power control, a feedback signal has to be detected rapidly.

In a power supply device of multi-phase interleaving control for performing multi-phase control using a plurality of phase current values, the control system generally detects output voltage or capacitance current, and feeds back a detection signal thus detected, the control system performing constant current control in an LC chopper circuit constituting a step-down chopper circuit that operates according to the multi-phase control by the multi-phase interleaving.

The speed for detecting this detection signal depends on a response speed of a detector. In general, as for the response speed of the detector, a detector for detecting a DC signal is slow in response, whereas a detector for detecting an AC signal can respond rapidly.

As for the response speed of step response, detection of a DC signal being output voltage of the step response is slow in response, and accordingly, this may interfere with the rapid response for feeding back the output voltage. Therefore, in order to accelerate the response of the control system that performs pulse power control, it is necessary to detect the output voltage rapidly.

An object of the present invention is to solve the aforementioned conventional problems, aiming at accelerating the multi-phase interleaving control in the power supply device. Another object of the present invention is to accelerate detection of the feedback signal, in accelerating the multi-phase interleaving control in the power supply device.

Means for Solving the Problems

As a control system, there is known a dead beat control that can expect more rapid dynamic response and higher gain, relative to the PI control. According to the dead beat control, a pulse width $\Delta T(k)$ is computed in every sampling cycle in a manner that an output of the $(k+1)^{th}$ sampling cycle becomes equal to a target value in a state equation obtained by discrete model development of a circuit state assuming inputs and outputs as state variables, and switching operation is controlled by thus obtained pulse width $\Delta T(k)$.

Power control in a power supply device where the dead beat control is applied to multi-phase interleaving is not yet known. If it is attempted to apply the dead beat control to respective phases in the multi-phase interleaving, it is necessary to obtain the pulse width $\Delta T(k)$ rapidly and stably according to the dead beat control per phase, in order to achieve rapid response. Therefore, for this rapid response, it is required to detect the output voltage rapidly as described above.

Given the situation that detection of a DC signal being the output voltage of the step response is slow in response, and thus this may interfere with rapid detection of a feedback signal, in detecting a voltage signal, there is provided a process where the detection signal obtained by the slow-response voltage detection is used as an initial value, and this initial value and a detection value of capacitance current detected at each point are used to obtain the voltage at a subsequent point according to high-speed discrete time process. This process is repeated successively so as to detect the voltage signal at each point.

According to this detection of the voltage signal, detection of output voltage actually using the detector is performed only when the initial value is detected. Detection of the output voltage at the subsequent points includes only detection values of capacitance current detected by an AC signal detector capable of rapid detection, in addition to the initial value of the output voltage. Therefore, rapid detection is possible without affected by the slow response in detecting the DC signal. Accordingly, in this rapid detection of the output voltage in the present invention, it is only the initial value that is obtained when the output voltage is actually detected, and only the capacitance current is detected in the subsequent detection according to the high-speed discrete time process. With this configuration, the multi-phase interleaving control in the power supply device can be accelerated.

In addition, when processing in one sampling cycle is completed and processing in the next sampling cycle is started, the output voltage as a final value detected in the previous sampling cycle is used as an initial value in a subsequent sampling cycle. Therefore, the output voltage in the subsequent sampling cycle can be obtained according to the discrete time process, using the initial value and the capacitance current value at each point, without detecting the output voltage by the detector.

(Power Supply Device)

A power supply device of the present invention includes an LC chopper circuit, provided with a controller configured to perform a step response control to follow a command value, according to multi-phase interleaving control for performing multi-phase control using a plurality of phase current values, and a switching signal generator configured to generate a switching signal.

The present invention is directed to power control by a power supply device where the dead beat control is applied to the multi-phase interleaving, and combined current of multiple phase current values is used as control current in the multi-phase control according to the multi-phase interleaving, thereby achieving control independent of the number of the detectors and the control system independent of the number of phases, and further, this control current is used to perform constant current control, so as to prevent overshooting and undershooting.

The present invention includes an aspect of the power supply device and an aspect of a method for controlling the power supply device. The present invention is directed to the power supply device of multi-phase interleaving control that performs multi-phase control using a plurality of phase current values, provided with an LC chopper circuit constituting a step-down chopper circuit that operates according to the multi-phase control of multi-phase interleaving, and a controller configured to perform a step response control according to the multi-phase control of an LC chopper circuit.

In the multi-phase control of the LC chopper circuit, the controller may perform switching control per phase of an LC circuit, according to the constant current control where the combined current of the respective phase current values in the LC chopper circuit is used as the control current.

The present invention is also directed to a method for controlling the power supply device including the LC chopper circuit, this method controlling the power supply device of multi-phase interleaving control that performs multi-phase control according to a plurality of phase current values, and performing switching control per phase of the LC circuit according to the constant current control where the combined current of the respective phase current values in the LC chopper circuit is used as the control current.

In the power supply device and the method for controlling the power supply device, the output voltage is acquired by an operation result of discrete time process, using an initial value of the output voltage at a predetermined point and detection values of capacitance current at respective points in the discrete time process. Accordingly, only the initial value is detected when the output voltage being slow in response is acquired, and only the detection of capacitance current being rapid in response can accomplish the detection needed in the discrete time process. Therefore, this enables rapid response.

In the discrete time process initially performed in the step response control, the output voltage is acquired by an operation of the discrete time process on the initial value of the output voltage at a predetermined point and a detection value of capacitance current detected at the point of the discrete time process in the initial operation cycle. In each operation cycle of the discrete time process of the subsequent step response control, repetition of the operation of the discrete time process performed on the operation result from the previous operation cycle and the detection value of capacitance current obtained in the present operation cycle allows acquisition of the output voltage in each operation cycle.

In a mode of the pulse power control where the step response control is performed with a single level command voltage, the predetermined point may correspond to a point for starting the step response control. In addition, the initial value may correspond to the output voltage that is detected at this start point.

In a mode of the two-level pulse power control where High-level command voltage and Low-level command voltage are provided alternately for the step response control, the predetermined point may correspond to an initial start point of the step response control, and the endpoint of the pulse power control of each level.

The output voltage detected at the initial start point of the step response control may correspond to an initial value for acquiring the output voltage in the initial pulse power control. In addition, the output voltage detected at the end point of the pulse power control of each level may be an initial value for acquiring the output voltage in the pulse power control of the level subsequent to the pulse power control of the present level.

In addition, the constant current control using control current may prevent overshooting and undershooting.

As the combined current of the respective phase current values, inductance current or capacitance current may be used, the inductance current flowing through connection ends of inductance per phase in the LC chopper circuit, and the capacitance current flowing through capacitance in the LC chopper circuit.

With an ammeter provided on the connection end of inductance, the combined current is detected, which is obtained by combining inductance current flowing through the inductance per phase, and a feedback signal of the combined current thus detected is used as the control current to perform the constant current control.

In addition, with the ammeter provided on the capacitance, the capacitance current is detected, and a feedback signal of thus detected capacitance current is used as the control current to perform the constant current control. The capacitance current is obtained by subtracting load current from the combined current of the inductance current values of respective phases, and accordingly, by detecting the capacitance current, the combined current of the inductance current can be detected.

In any of the configurations; the configuration for detecting the inductance current and the configuration for detecting the capacitance current, only one detection means is sufficient as a mechanism for detecting the control current.

In addition, in any of the configurations; the configuration for detecting the inductance current and the configuration for detecting the capacitance current, only one control system is sufficient as the control system for performing the constant current control by using the control current.

The constant current control using the inductance current can prevent overshoot and undershoot, and allows the output voltage to follow the command voltage being the target value.

When the constant current control is performed by feeding back the inductance current, the step response of the output voltage increases exponentially toward voltage that is determined according to a predetermined inductance current value, without inducing secondary oscillating voltage. Therefore, the constant current control using the inductance current allows the step response of the output voltage to converge into the predetermined value, without overshoot or undershoot.

In the constant current control using the inductance current, the inductance current flowing through the connection ends of inductance per phase in the LC circuit is employed as the control current. Alternatively, capacitance current flowing through the capacitance in the LC circuit may be employed as the control current, since the inductance current is equal to a sum of the capacitance current and load current. The constant current control using the inductance current is performed so that a difference becomes zero, the difference between the inductance current and a rated current value, or between the inductance current and a value obtained by multiplying the rated current value by a predefined factor.

(Control Mode)

One mode of control in the power supply device of the present invention is a two-level dead beat control by a two-way step-down chopper circuit employing multi-phase interleaving without using PI control.

In the interleaving method, the number of phases n is set to establish multi-phase, whereby the switching frequency becomes n-times higher than a drive switching frequency, thereby achieving n-times more control response. In addition, as a smoothing capacitor, a value corresponding to the switching frequency n-times higher than the drive switching frequency is employed, and accordingly, drastic volume reduction of the smoothing capacitor may be expected.

In general, a detector for detecting a DC signal is slow in response speed, whereas an AC transformer for detecting an AC signal can respond rapidly. Therefore, according to the mode where capacitance current is used as the control current in the power supply device of the present invention, AC signals of the capacitance current can be detected rapidly, thereby enabling rapid response in the dead beat control, even though DC signals including other AC components are detected at a relatively low speed.

In addition, according to an aspect of the present invention, the constant current control can prevent overshoot and undershoot of the step response.

Furthermore, according to an aspect of the present invention, since the control current is combined current of the inductance current values of respective phases, it is possible to reduce the number of detectors for detecting feedback signals being the control current.

There are known class-A to class-E amplifiers as amplifiers to control the RF power by converting the previous stage DC voltage to AC voltage, with the use of an inverter in the LC chopper circuit. Among those amplifiers, the class-A to class-C amplifiers control RF power by a dropper system, and therefore, conversion efficiencies of the RF power are approximately from 30% and 50%. On the other hand, the class-D amplifier and the class-E amplifier control the RF power with varying the DC voltage on the previous stage by using the switching system, and thus high conversion efficiencies of the RF power, from 90% to 93%, can be obtained in typical high frequency of 13.56 MHz.

Therefore, in the dead beat control according to multi-phase interleaving in the power supply device of the present invention, the class-D amplifier and the class-E amplifier are suitable as amplifiers to which the switching control is applicable.

BRIEF DESCRIPTION OF THE DRAWINGS

FIG. 15 illustrates an example for controlling an RF generator to which the power supply device of the present invention is applied:

BEST MODE FOR CARRYING OUT THE INVENTION

Figure 1:
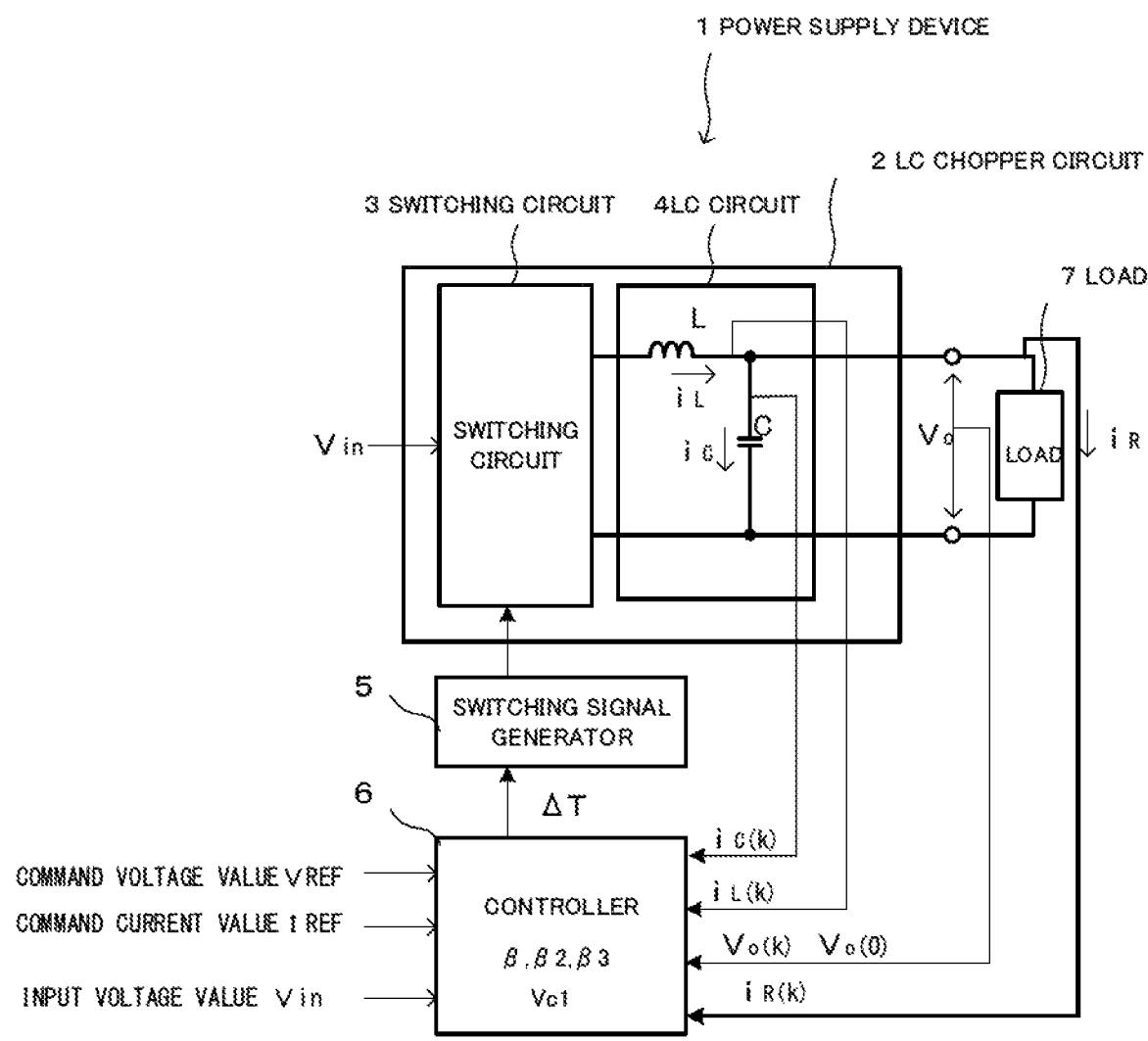
FIG. 1 illustrates an example of a schematic configuration of a power supply device according to the present invention.
Figure 10:
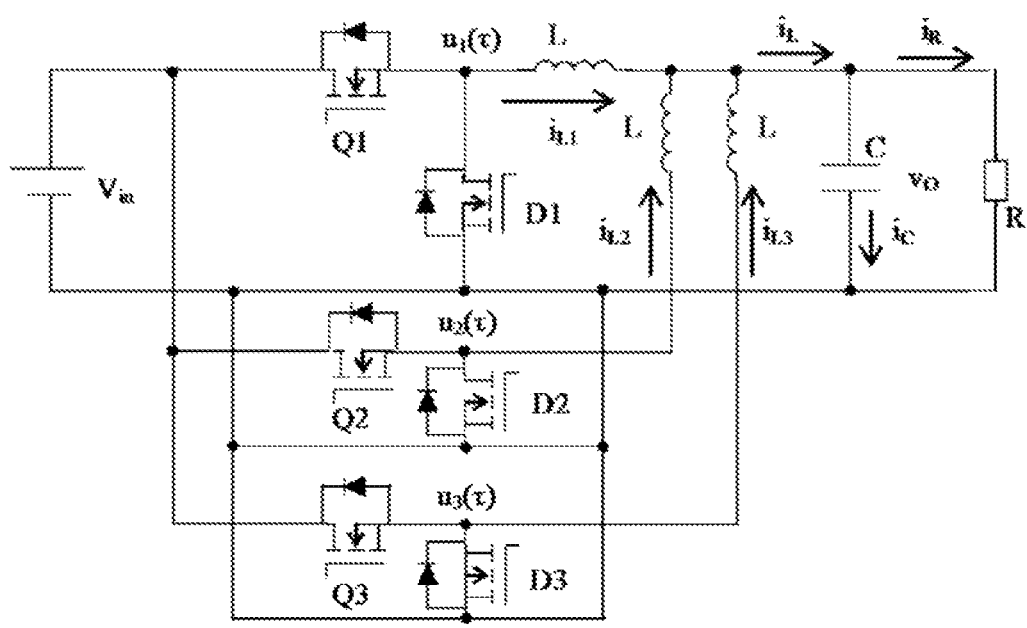
FIG. 10 illustrates an example of a chopper circuit in the power supply device according to the present invention.
Figure 11:
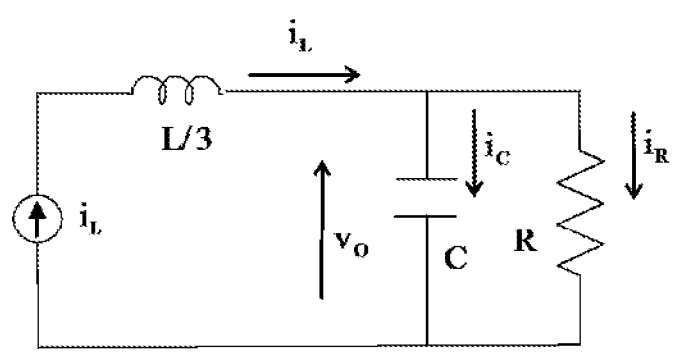
FIG. 11 illustrates an LCR circuit in the power supply device according to the present invention.
Figure 12:
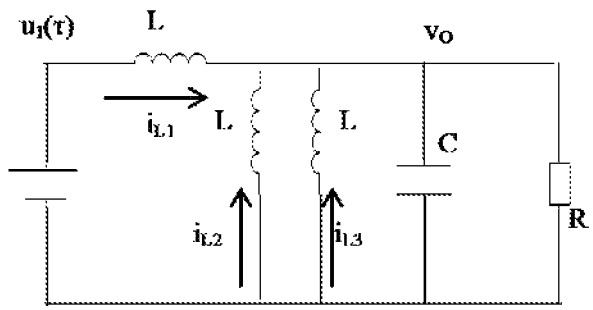
FIG. 12 illustrates an equivalent circuit of the LCR circuit in the power supply device according to the present invention.

There will now be described a power supply device and a method for controlling the power supply device of the present invention, with reference to the accompanying drawings FIGS. 1 to 18. With reference to FIG. 1, a schematic configuration of the power supply device of the present invention will be described, and with reference to FIGS. 2 to 9, an example for controlling the power supply device of the present invention will be described. With reference to FIGS. 10 to 12, derivation of the pulse width $\Delta T(k)$ of the present invention will be described, and with reference to FIGS. 13 and 14, followability to a command value will be described. With reference to FIGS. 15 to 18, application examples of the power supply device of the present invention will be described.

(Schematic Configuration of the Power Supply Device of the Present Invention)

With reference to FIG. 1, a schematic configuration of the power supply device of the present invention will be described. The power supply device 1 of the present invention comprises an LC chopper circuit 2 configured to receive input voltage Vin and to deliver output voltage vo and load current iR, a switching signal generator 5 configured to generate a switching signal for controlling ON/OFF operations of a switching element in the LC chopper circuit 2, and a controller 6 configured to input feedback signals from the LC chopper circuit 2 and a load, computing a pulse width $\Delta T(k)$, and to output thus computed pulse width $\Delta T(k)$ to the switching signal generator 5.

The LC chopper circuit 2 comprises an LC circuit 4 including series-parallel connection of inductance L and capacitance C, and a switching circuit 3 configured to provide the LC circuit 4 with inductance current iL formed by performing multi-phase switching control on the input voltage Vin.

The controller 6 computes the pulse width $\Delta T(k)$ of the switching signal for controlling ON/OFF operations of the switching element in the switching circuit 3. The pulse width $\Delta T(k)$ determines a time width of the ON state of the switching element in one cycle of switching, and controls power supplied to the load through the LC circuit 4, based on the length of the pulse width $\Delta T(k)$. By way of example, assuming the time width of the switching cycle as T, the pulse width $\Delta T(k)$ with respect to the time width T is represented in the form of duty ratio.

The controller 6 computes the pulse width $\Delta T(k)$ as to each sampling cycle, so that an output of the $(k+1)^{th}$ sampling cycle may become a target value, and performs the dead beat control for controlling the switching operation according to thus obtained pulse width $\Delta T(k)$. The controller 6 performs, in the dead beat control, constant current control in a predetermined cycle based on the control current including combined current obtained by combining phase current values within the LC chopper circuit 2, and further computes the pulse width $\Delta T(k)$ of the switching signal for driving the switching element (not illustrated) of the switching circuit 3 in the LC chopper circuit 2, every sampling cycle T.

The controller 6 sets the pulse width $\Delta T(k)$ computed by the constant current control using the control current including the combined current, as the pulse width $\Delta T(k)$ per phase current. The constant current control using the control current may prevent secondary oscillating voltage of output voltage in the step response.

The switching signal generator 5 of the present invention generates a per-phase switching signal, setting the pulse width $\Delta T(k)$ computed by the controller 6, as the pulse width $\Delta T(k)$ of the per-phase current. The pulse width $\Delta T(k)$ is computed on the basis of the control current including the combined current that is obtained by combining the phase current values. In this computation, since the control current is based on the combined current of the phase current values, restrictions caused by overlapping between the pulse widths ΔT(k) of the respective phases can be eliminated. Therefore, it is possible to obtain the pulse width ΔT(k) where the pulse widths ΔT of the respective phases are allowed to overlap one another.

Figure 2:
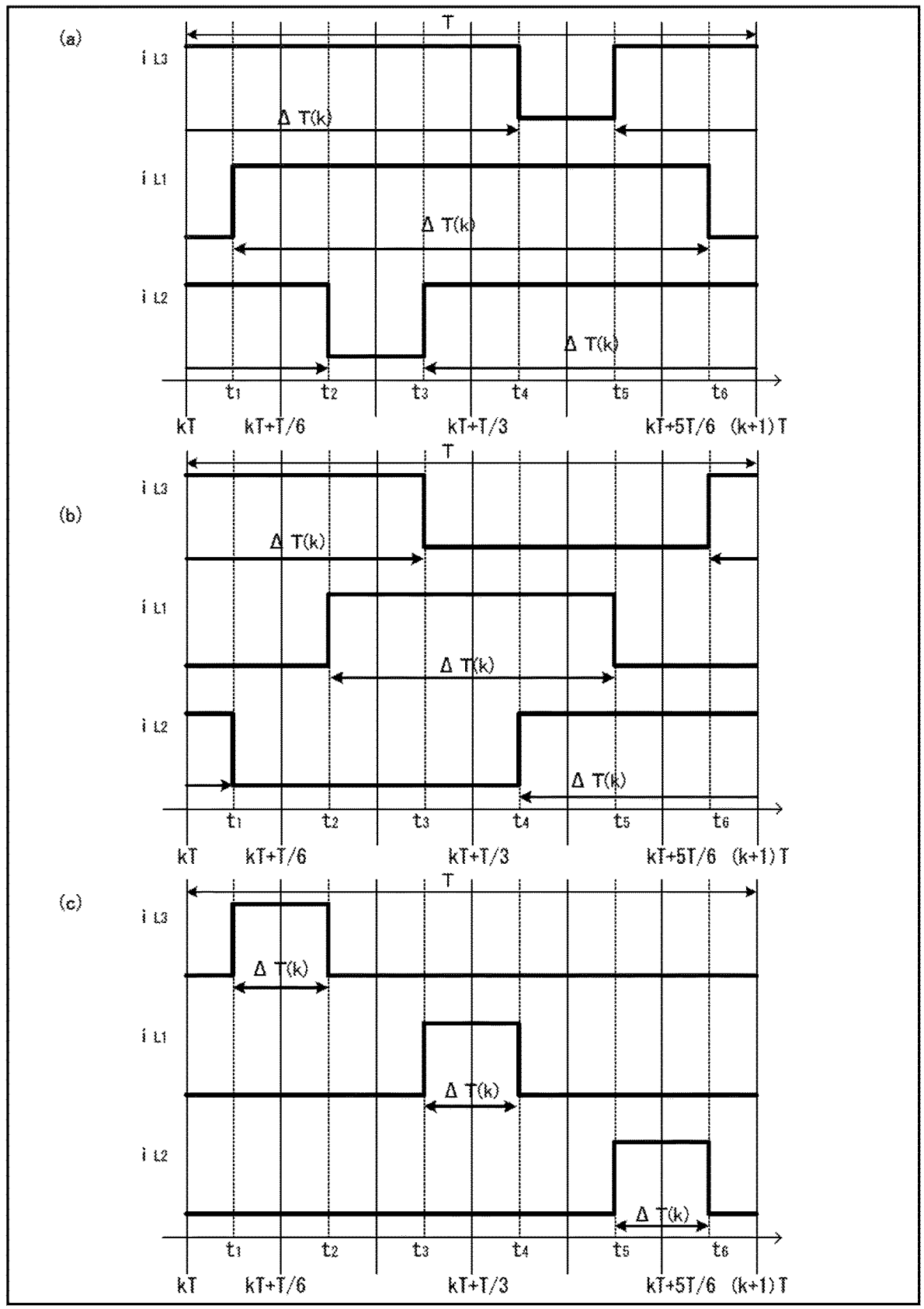
FIG. 2 illustrates examples of pulse width $\Delta T(k)$ for the case of phase current controlled by the power supply device according to the present invention.

FIG. 2 illustrates an example of the pulse width ΔT(k) for the case of three-phase current. FIG. 2(a) illustrates an example where the pulse widths ΔT(k) of phase current of the three phases overlap one another, with respect to the time width T in one cycle of switching. FIG. 2(b) illustrates an example where the pulse widths ΔT(k) of the current of two phases out of the three phases overlap one another, with respect to the time width T in one cycle of switching. FIG. 2 (c) illustrates an example where the pulse widths ΔT(k) of phase current of the three phases do not overlap.

When the switching operation is performed in the switching circuit 3 according to n-phase multi-phase interleaving, inductance current iL1 to iLn flow respectively through n inductance L (L1 to Ln) in the LC chopper circuit 2. The controller 6 receives inputs, as the constant current, the current including the combined current iL that is obtained by combining the respective phase current values corresponding to the inductance current iL1 to iLn.

As the control current, capacitance current is may also be used, which is obtained by subtracting load current iR from the combined current iL, instead of the combined current IL obtained by combining the inductance current of the respective phase current.

(Constant Current Control)

The constant current control according to the controller 6 includes a plurality of control modes. Those control modes include, a mode of inductance current control, a mode of capacitance current control, and a control mode combining the inductance current control and the capacitance current control.

With reference to FIGS. 3 to 8, there will now be described the multiple modes of constant current control, and the pulse width ΔT(k) in each of the control modes.

(Modes of Constant Current Control and Pulse Width ΔT(k))

In the LCR circuit comprising the LC chopper circuit 2 in FIG. 1, which is connected to the load 7, inductance current iL of the inductance L or the capacitance current ic of the capacitance C in the LC chopper circuit is used as the control current to perform the constant current control. The inductance current iL(t), the capacitance current ic(t), and the output voltage vo(t) are expressed by the following formula 2, respectively:

$$i_L(t) = i_C(t) + i_R(t) = A_V\{V_{REF} - v_O(t)\} + \beta i_C(t) + i_R(t) \quad (2)$$

$$i_C(t) = \frac{A_V}{1-\beta}\{V_{REF} - v_O(t)\} = C\frac{d}{dt}v_O(t)$$

$$v_O(t) = V_{REF}\{1 - e^{-\frac{A_V}{(1-\beta)C}t}\}$$

In the multi-phase interleaving, the inductance current iL(t) in the formula 2 above is combined current obtained by combining the inductance current values iL1 to iLn of the respective phases of n inductance L (L1 to Ln), included in the LC chopper circuit. There is a relationship of iL(t)=ic(t)+iR(t) between the inductance current iL(t) and the capacitance current ic. Here, iR(t) represents load current of the load R.

In the three-phase interleaving control as an example of the multi-phase interleaving control, the pulse width ΔT(k) when the constant current control is performed, using the aforementioned inductance current and the capacitance current as the control current, is expressed by the following formula 3:

$$\Delta T(k) = \frac{1}{V_{in}(k)}\left\{\frac{L}{3}i_L(k+1) - \frac{L}{3} - \frac{T^2}{2C}i_L(k) + Tv_O(k) - \frac{T^2}{2C}i_R(k)\right\} \quad (3)$$

where Vin(k) is input voltage, vo(k) is output voltage, iL(k) is combined current of inductance current values of respective phases, iR(k) is load current, L is inductance of the LC circuit, C is capacitance of the LC circuit, and T is the sampling cycle.

The constant current control may be either the inductance current-based constant current control where the inductance current is used as the control current, or the capacitance current-based constant current control where the capacitance current is used as the control current.

There will now be described each of the constant current control modes, the mode of inductance current-based constant current control, the mode of capacitance current-based constant current control, and the control mode combining the inductance current-based constant current control and the capacitance current-based constant current control. In here, three-phase interleaving control will be described as an example of the multi-phase interleaving control.

(Mode of Inductance Current-Based Constant Current Control)

Figure 3:
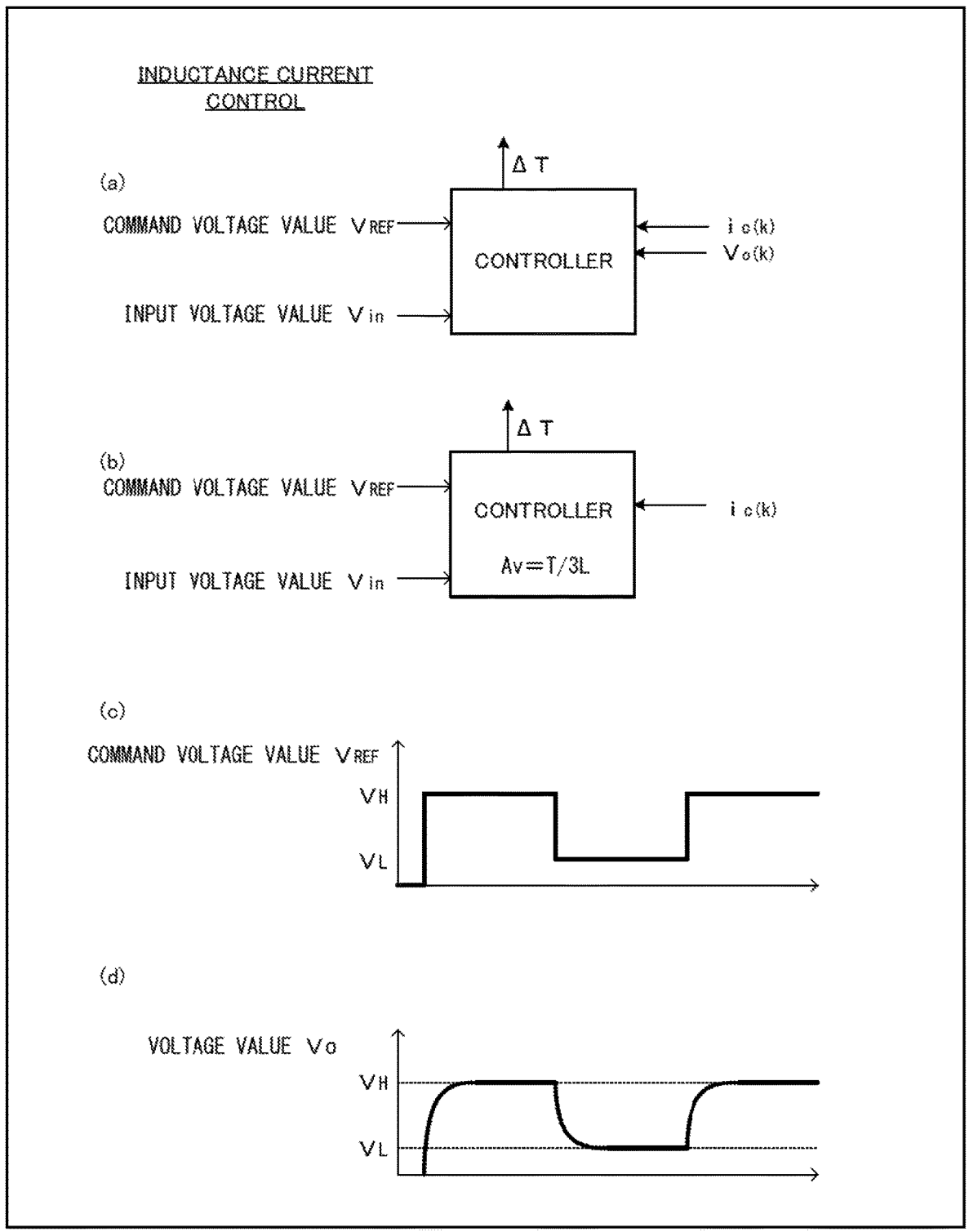
FIG. 3 illustrates an example of inductance current control by the power supply device according to the present invention.

FIG. 3 schematically illustrates the modes of the inductance current control performed by the controller, FIGS. 3(a) and 3(b) illustrate schematic configurations of the control mode, FIG. 3(c) shows an example of the command voltage VREF, and FIG. 3(d) shows an example of the output voltage vo.

FIG. 3 illustrates two configuration examples of the inductance current-based constant current control, taking the three-phase interleaving control as an example. The inductance current-based constant current control performs current control, so that a difference may become zero between the inductance current and a rated current value or a value obtained by multiplying the rated current value by a predefined factor.

In the configuration of FIG. 3(a), according to the mode of inductance current-based constant current control of the three-phase interleaving control, the pulse width ΔT(k) expressed by the following formula 4 is used, and with the use of the capacitance current ic(k) and the output voltage vo(k) being fed back, the step response control is performed so that the output voltage vo(k) may become equal to the command voltage VREF.

$$\Delta T(k) = \frac{1}{V_{in}(k)}\frac{L}{3}\left[A_V V_{REF} - \left(1 - \beta_3 - \frac{3T^2}{2LC}\right)i_C(k) + \left(\frac{3}{L}T - A_V\right)v_O(k)\right] \quad (4)$$

In the configuration of FIG. 3(b), according to the mode of inductance current-based constant current control of the three-phase interleaving control, the pulse width ΔT(k) expressed by the following formula 5 is used, and with the use of the capacitance current ic(k) being fed back, the step response control is performed so that the output voltage vo(k) may become the command voltage VREF. In this configuration, by setting the factor Av as Av=3T/L, feedback of the output voltage vo(k) becomes unnecessary, and thus only the capacitance current ic(k) is detected and fed back, to determine the pulse width ΔT(k):

$$\Delta T(k) = \frac{V_{REF} - \left(\frac{(1-\beta_3)L}{3T} - \frac{T}{2C}\right)i_C(k)}{V_{in}(k)}T \quad (5)$$

The command voltage VREF as shown in FIG. 3(c) illustrates an example of two-level command voltage, High level VH and Low level VL in the H/L two-level control, and the output voltage vo as shown in FIG. 3(d) illustrates an example of the two-level step response.

The voltage waveforms in FIGS. 3(c) and 3(d) are schematically shown for the illustration purpose, not indicating actual voltage waveforms.

(Mode of Capacitance Current-Based Constant Current Control)

Figure 4:
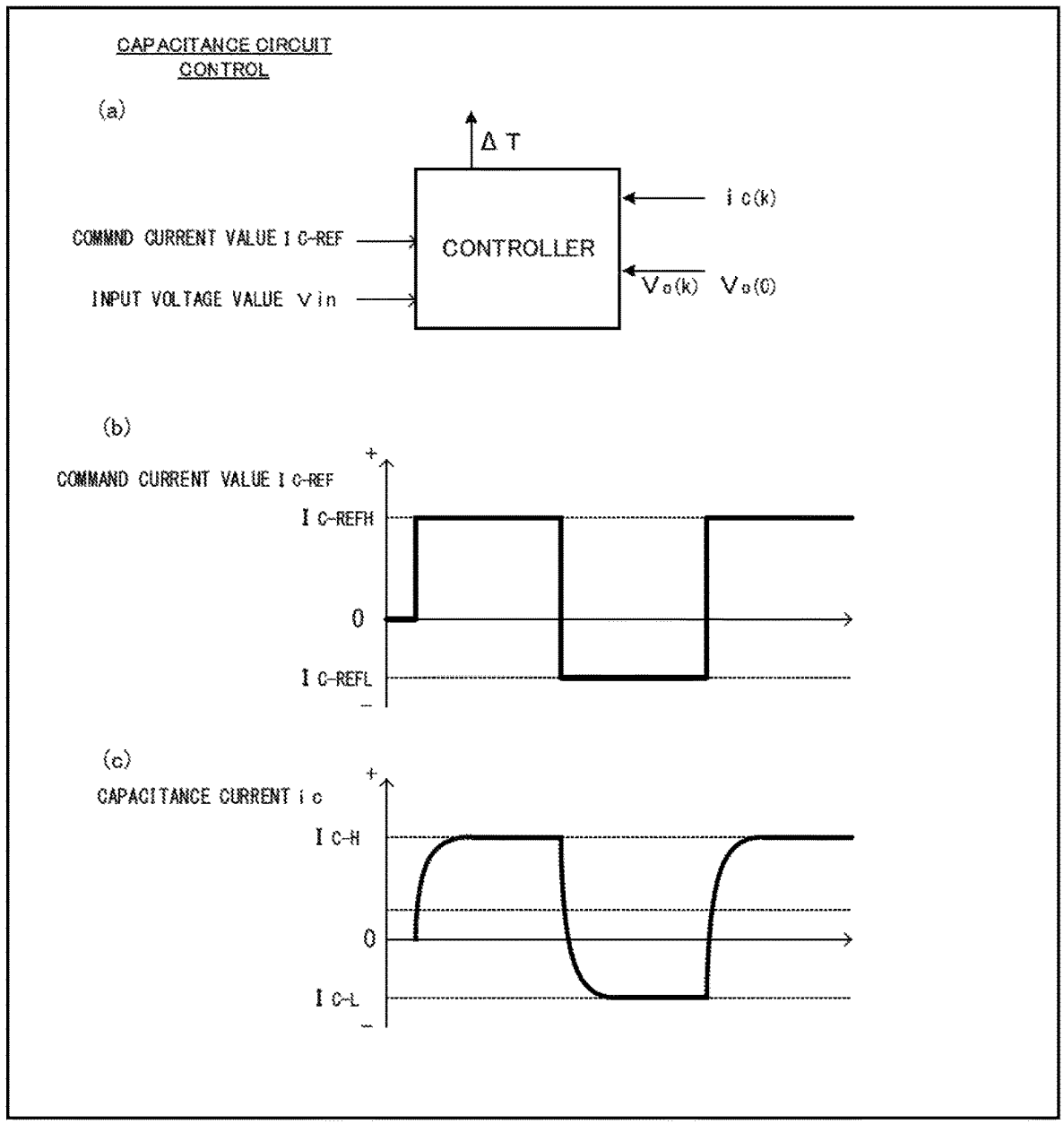
FIG. 4 illustrates an example of capacitance current control by the power supply device according to the present invention.

FIG. 4 schematically illustrates an example of three-phase interleaving control for the mode of the capacitance current control according to the controller, FIG. 4(a) illustrates a schematic configuration, FIG. 4(b) illustrates an example of the command current IC-REF of the capacitance current, and FIG. 4(c) shows the capacitance current ic.

In the configuration of FIG. 4(a), according to the mode of capacitance current-based constant current control in the three-phase interleaving control, the pulse width ΔT(k) expressed by the following formula 6 is used, and with the use of the capacitance current ic(k) and the output voltage vo(k) being fed back, the step response control is performed so that the capacitance current may become equal to the capacitance command current IC-REF.

$$\Delta T(k) = \frac{\frac{L}{3}I_{C\text{-}REF} - \left(\frac{L}{3} - \frac{T^2}{2C}\right)i_C(k) + Tv_O(k)}{V_{in}(k)} \quad (6)$$

The command current IC-REF of the capacitance current as shown in FIG. 4(b) includes an example of two-level command current IC-REFH corresponding to High level VH, and. IC-REFL corresponding to Low level VL in H/L two-level control, and the capacitance current is as shown in FIG. 4(c) indicates an example of two-level step response.

The voltage waveforms as shown in FIGS. 4(b) and 4(c) are schematically shown for the illustration purpose, not indicating actual voltage waveforms.

(Control Mode Combining the Inductance Current-Based Constant Current Control and the Capacitance Current-Based Constant Current Control)

The constant current control of the present invention is further provided with a mode for performing the step response control according to the multi-stage constant current control mode including the capacitance current-based constant current control, and the inductance current-based constant current control performed subsequently, in addition to the mode of the inductance current-based constant current control, and the mode of capacitance current-based constant current control.

This multi-stage control mode includes a first control mode for performing the inductance current-based constant current control after performing the capacitance current-based constant current control, and a second control mode for performing two-stage capacitance current-based constant current control, and subsequently the inductance current-based constant current control is performed.

Figure 5:
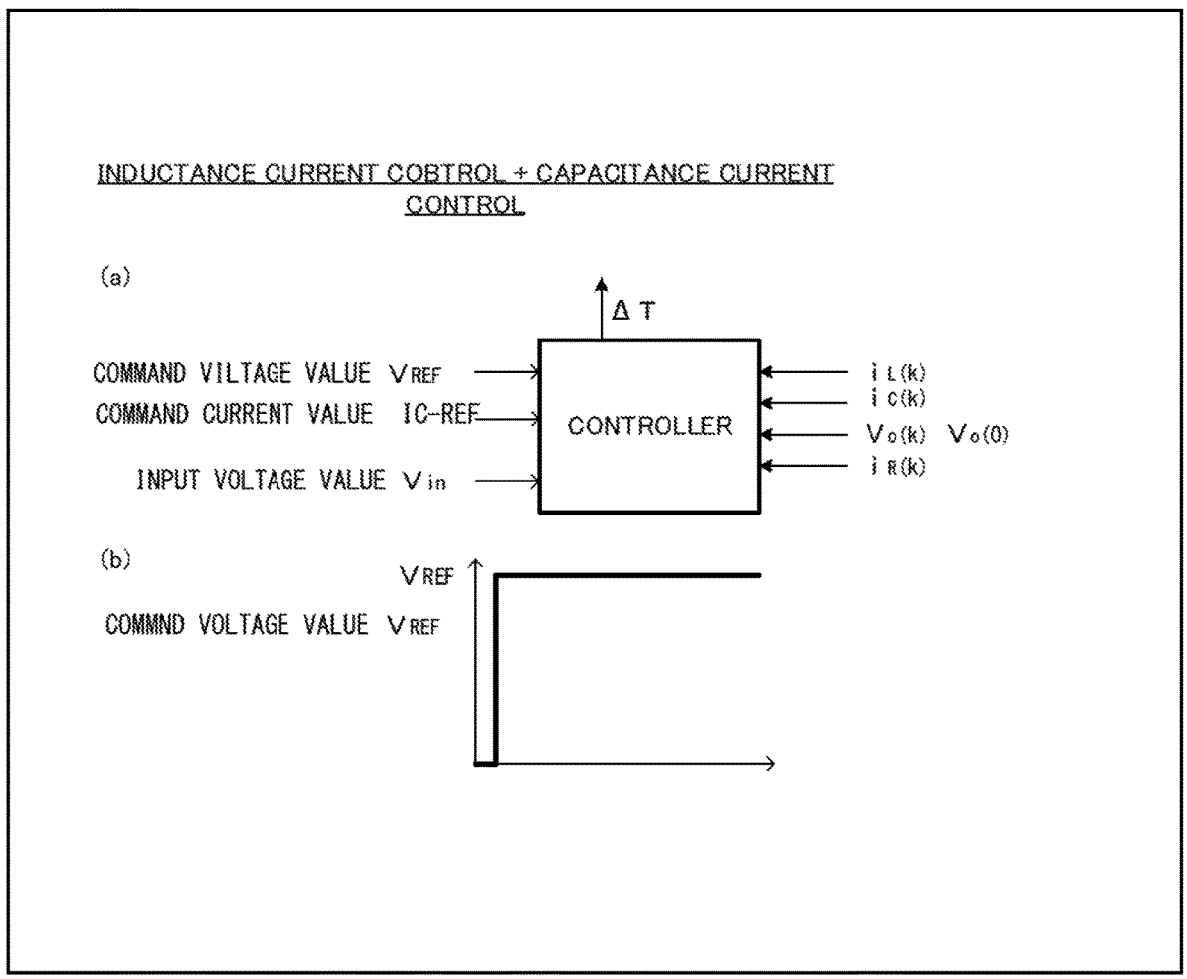
FIG. 5 illustrates an example of the inductance current control and the capacitance current control by the power supply device according to the present invention.
Figure 6:
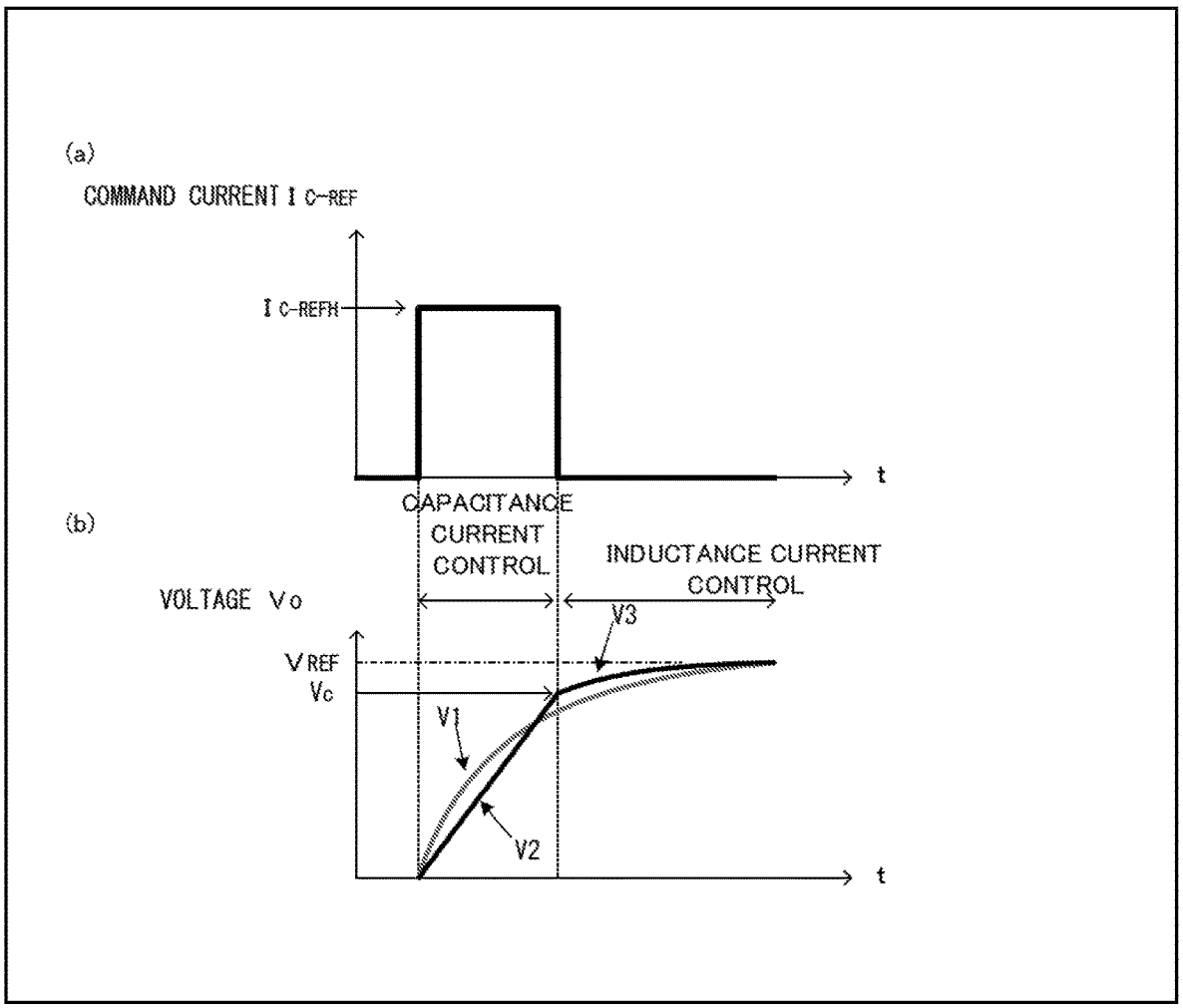
FIG. 6 illustrates one mode of the inductance current control and the capacitance current control by the power supply device according to the present invention.
Figure 7:
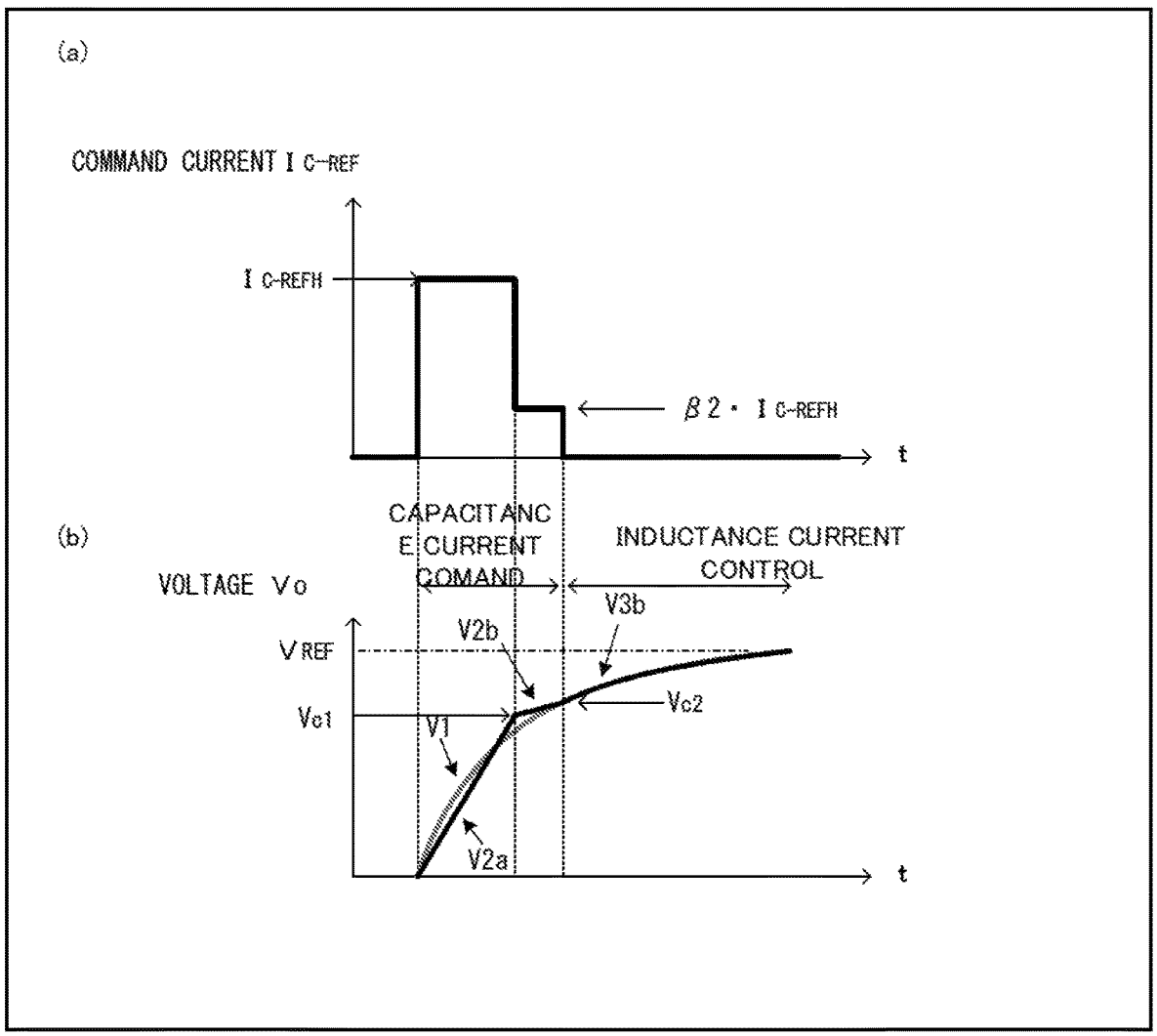
FIG. 7 illustrates one mode of the inductance current control and the capacitance current control by the power supply device according to the present invention.

FIGS. 5 to 7 illustrate the control mode combining the inductance current-based constant current control and the capacitance current-based constant current control. FIG. 5(a) schematically illustrates the controller and FIG. 5(b) illustrates the command voltage VREF.

In the control mode combining the capacitance current-based constant current control and the inductance current-based constant current control, FIGS. 6(a) and 6(b) illustrate the command current IC-REF and the output voltage vo in the first control mode. FIGS. 7(a) and 7(b) illustrate the command current IC-REF and the output voltage vo in the second control mode when the capacitance current-based constant current control is performed in two stages, mode1 and mode1, and thereafter, the inductance current-based constant current control is performed in mode3.

(First Control Mode)

In the control mode combining the capacitance current-based constant current control and the inductance current-based constant current control, for the case of the first control mode, the capacitance current-based constant current control is performed in the first-stage. When the output voltage vo reaches the switching voltage Vc, it is switched to the inductance current-based constant current control in the second stage, and then, the constant current control is performed to follow the command voltage VREF.

In the first-stage capacitance current-based constant current control, the aforementioned pulse width ΔT(k) according to the capacitance current-based constant current control is used, and in the second-stage inductance current-based constant current control, the aforementioned pulse width ΔT(k) according to the inductance current-based constant current control is used.

If it is assumed that the inductance current-based constant current control is performed over the entire interval of the step response, there is a possibility of overcurrent occurrence. In order to avoid this overcurrent, the capacitance current-based constant current control is combined.

The control mode that is performed by combining the capacitance current-based constant current control and the inductance current-based constant current control can avoid occurrence of overcurrent that is expected by the inductance current-based constant current control. On the first stage, the capacitance current-based constant current control is performed to prevent occurrence of the overcurrent, and after the timing of no more risk of overcurrent, on the second stage, the capacitance current-based constant current control is switched to the inductance current-based constant current control, and then, the output voltage vo is controlled to follow the control command voltage VREF being the target value.

The switching voltage Vc is used to switch the first-stage capacitance current-based constant current control to the second-stage inductance current-based constant current control, so as to prevent the output voltage from overshooting the target value, due to current energy stored in the inductance during the capacitance current-based constant current control.

The control mode shown in FIG. 6 indicates that the inductance current control is performed subsequent to the capacitance current control. In the voltage waveform as shown in FIG. 6(b), voltage V1 indicated by the thin solid line represents the step response when the inductance current-based constant current control is performed over the entire interval, and the voltage indicated by the thick solid line represents the step response of the control mode combining the capacitance current-based constant current control and the inductance current-based constant current control, including voltage V2 during the capacitance current control and the voltage V3 during the inductance current control.

In the capacitance current control, the constant current control is performed on the basis of the command current IC-REF as shown in FIG. 6(a), controlling the output voltage vo to follow the target value, while preventing occurrence of overcurrent, and when the output voltage vo reaches the switching voltage Vc that is set to keep the output voltage vo from overshooting the target value, the control is switched to the inductance current-based constant current control. The voltage used in the capacitance current control is indicated as voltage V2. Thereafter, the voltage is controlled to follow the command voltage VREF by the inductance current-based constant current control. The voltage used in the inductance current control is indicated as voltage V3.

(Second Control Mode)

In the control mode combining the capacitance current-based constant current control and the inductance current-based constant current control, according to the second control mode, two-stage capacitance current-based constant current control is performed, and thereafter the inductance current-based constant current control is performed.

In the control mode as shown in FIG. 7, the two-stage mode is illustrated where subsequent to the capacitance current-based constant current control, the inductance current-based constant current control is performed. FIG. 7(a) illustrates the command current IC-REF in the capacitance current-based constant current control, and FIG. 7(b) illustrates voltage waveforms of the output voltage vo. In the voltage waveforms as shown in FIG. 7(b), voltage V1 indicated by the thin solid line represents the step response when the inductance current-based constant current control is performed over the entire interval. In the mode combining the capacitance current-based constant current control and the inductance current-based constant current control, the voltage indicated by the thick solid line represents the step response according to voltage V2a when the first-stage capacitance current-based constant current control is performed, voltage V2b when the second-stage capacitance current-based constant current control is performed, and voltage V3b when the inductance current control is performed. FIG. 7(b) illustrates the state that voltage V1 and voltage V3b substantially overlap one another when the inductance current-based constant current control is performed.

In the first-stage capacitance current-based constant current control, on the basis of the command current IC-REF as shown in FIG. 7(a), the constant current control is performed to control the output voltage vo to follow the target value, with preventing occurrence of overcurrent, and when the voltage reaches the switching voltage Vc1 that is defined so as to keep the output voltage vo from overshooting the target value, the control is switched to the second-stage capacitance current-based constant current control. The voltage in the first-stage capacitance current-based constant current control is indicated as voltage V2a, and the voltage in the second-stage capacitance current-based constant current control is indicated as voltage V2b.

In the second-stage capacitance current-based constant current control, when the output voltage vo reaches the switching voltage Vc2, the control is switched to the inductance current-based constant current control. The voltage in the second-stage capacitance current-based constant current control is indicated as voltage V2b.

Thereafter, the voltage is controlled to follow the command voltage VREF by the inductance current-based constant current control. The voltage in the inductance current-based constant current control is indicated as voltage V3b.

The second-stage capacitance current-based constant current control connects the first-stage capacitance current-based constant current control, with the inductance current-based constant current control, and cancels voltage deviation that may occur when the constant current control is switched. Therefore, this allows the voltage at the time of starting the inductance current-based constant current control after switched from the capacitance current-based constant current control to be brought into agreement with theoretical voltage value for the case where only the inductance current-based constant current control is performed over the entire interval without performing the capacitance current control. Accordingly, the switching voltage Vc2 upon switching from the second-stage capacitance current-based constant current control to the inductance current-based constant current control corresponds to the switching voltage that is expected to obtain if only the inductance current-based constant current control is performed.

The aforementioned first-stage capacitance current-based constant current control, the second-stage capacitance current-based constant current control, and the inductance current-based constant current control correspond respectively to the capacitance current-based constant current control of mode1 and mode2 described below, and the inductance current-based constant current control of mode3. The command current and voltage waveforms in FIGS. 6 and 7 are schematically shown for the illustration purpose, not indicating actual voltage waveforms.

Table 1 shows a relationship between command signals and input signals of the inductance current-based constant current control and the capacitance current-based constant current control.

TABLE 1

| Constant Current Control | Command Signal | Input Signal |
| --- | --- | --- |
| Capacitor Current | Ic-$_{REF}$ | Vin<br>ic(k)<br>Vo(k) |
| Inductor Current | V-$_{REF}$ | ic(k)<br>(Vo(k)) |

Figure 8:
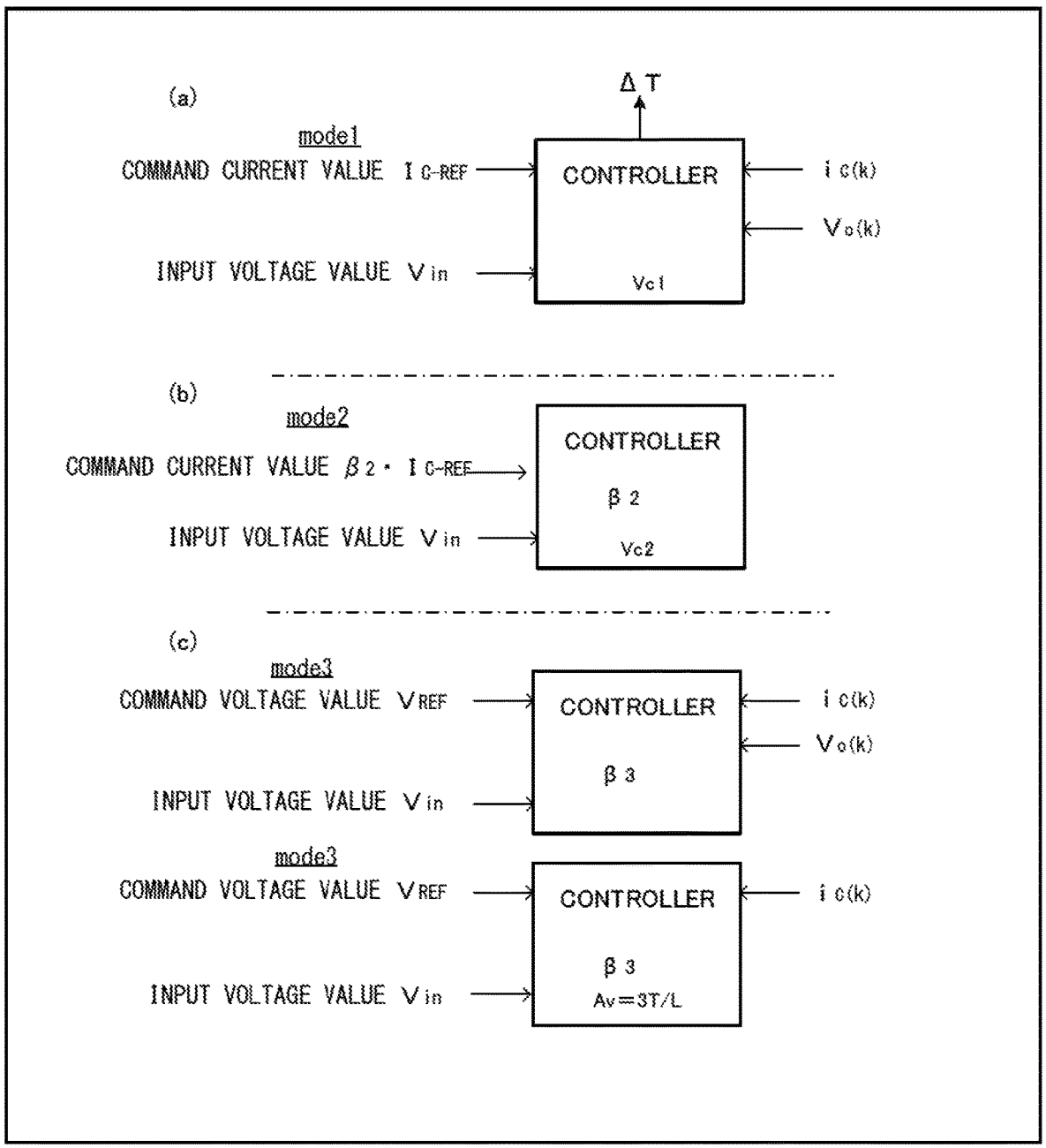
FIG. 8 illustrates examples of the inductance current control and the capacitance current control by the power supply device according to the present invention.

There will now be described the constant current control modes performed by each of the modes; mode1, mode2 and mode3, in one step response. FIG. 8 illustrates each of the control modes; mode1, mode2 and mode3. FIG. 8(a) illustrates the control mode of mode1, FIG. 8 (b) illustrates the control mode of mode2, and FIG. 8(c) illustrates the control mode of mode3. In the following, descriptions will be provided, taking the three-phase interleaving control as an example of the multi-phase interleaving control.

In the constant current control, the step response is given according to the multi-stage constant current control including two-stage capacitance current-based constant current control of mode1 and mode2, followed by the inductance current-based constant current control of mode3.

Mode1:

The constant current control of mode1 corresponds to the first stage of the two-stage capacitance current-based constant current control. In the mode1-constant current control, the output voltage is prevented from overshooting the target value, due to current energy stored in the inductance. In the first stage mode1, voltage Vc1 is preset for the switching to the subsequent second-stage mode2, and mode1 is terminated when the output voltage vo reaches the switching voltage Vc1, and the stage is shifted to mode2.

The pulse width ΔT(k) of mode1 in the three-phase interleaving control is expressed by:

$$\Delta T(k) = \frac{\frac{L}{3}I_{C\text{-}REF} - \left(\frac{L}{3} - \frac{T^2}{2C}\right)i_C(k) + Tv_O(k)}{V_{in}(k)} \quad (7)$$

FIG. 8(a) illustrates the mode of mode1-capacitance current-based constant current control. The controller receives the input voltage Vin, and feedback of capacitance current ic(k) and output voltage vo(k), to perform the constant current control to follow the command current IC-REF of the capacitance current.

Mode2:

The mode2-constant current control corresponds to the second stage of the two-stage capacitance current-based constant current control. The mode2-constant current control is a transfer mode where the output voltage vo achieved according to the mode1-capacitance current-based constant current control is shifted to initial voltage from which the mode3-inductance current-based constant current control starts.

The capacitance current-based constant current control has a function to prevent overcurrent, but it is not provided with a function to control the output voltage to follow the target value. Therefore, control for preventing the output voltage from overshooting the target value is required. After the capacitance current-based constant current control is performed, the control is switched to the inductance current-based constant current control so that the output voltage may not overshoot the target value, but the output voltage vo at the time of switching may be different from the output voltage vo that is expected to obtain if the inductance current-based constant current control is performed over the entire interval of the step response, and this may cause a deviation therebetween.

As thus described, in the control mode where switching to the inductance current-based constant current control is performed after the capacitance current-based constant current control, a deviation may occur between the voltage at the time of switching to the inductance current-based constant current control, and the voltage expected to obtain if the inductance current-based constant current control is performed over the entire interval of the step response. Accordingly, the post-switching inductance current-based constant current control may start from the voltage different from the output voltage expected to obtain if the inductance current-constant current control is performed over the entire interval.

The two-stage control of the capacitance current-based constant current control, mode1 and mode2, can cancel the difference in voltage generated at the time of switching. In this control mode, the capacitance current-based constant current control is configured to have two stages, mode1 and mode2, and deviation of the output voltage that may occur in the mode1-constant current control can be canceled in mode2, bringing the voltage value for starting the mode3-inductance current-based constant current control into agreement with the output voltage that is expected to obtain by the inductance current-based constant current control if it is performed over the entire interval of the step response. With this configuration, the output voltage for starting the mode3 inductance current-based constant current control corresponds to a theoretical output voltage value that is obtained if the inductance current-based constant current control is performed over the entire interval of the step response.

Therefore, the interval of mode2 indicates a transitional interval for adjusting a final value of mode2 to agree with a predetermined value of mode3, and the constant current control is performed so that the initial value of mode2 corresponds to the final value of mode1, and the final value of mode2 corresponds to the initial value Vc2 that is required in mode3.

The pulse width ΔT(k) of mode2 in the three-phase interleaving control is expressed by:

$$\Delta T(k) = \frac{\frac{L}{3}\beta_2 I_{C\text{-}REF} - \left(\frac{L}{3} - \frac{T^2}{2C}\right)I_{C\text{-}REF} + TV_{C1}}{V_{in}(k)} \quad (8)$$

FIG. 8(b) illustrates the control mode of the mode1-capacitance current-based constant current control. The controller performs the constant current control, to follow the command current β2-IC-REF of capacitance current. β2 is a factor for setting the command current in mode1.

Mode3:

In mode3, the output voltage vo is controlled by the inductance current-based constant current control, so that the output voltage vo may not overshoot the target value. If the two-level control of High/Low is performed, the constant current control is performed so that the output voltage may not overshoot or undershoot the target values VH and VL.

The pulse width ΔT(k) of mode3 in the three-phase interleaving control is expressed by:

$$\Delta T(k) = \frac{1}{V_{in}(k)}\frac{L}{3}\left[A_V V_{REF} - \left(1 - \beta_3 - \frac{3T^2}{2LC}\right)i_C(k) + \left(\frac{3}{L}T - A_V\right)v_O(k)\right] \quad (9)$$

Furthermore, when Av is set as Av=3T/L, it is expressed by:

$$\Delta T(k) = \frac{V_{REF} - \left\{\frac{(1-\beta_3)L}{3T} - \frac{T}{2C}\right\}i_C(k)}{V_{in}(k)}T \quad (10)$$

FIG. 8(c) illustrates control mode of the mode3-inductance current-based constant current control. The controller receives the feedback of capacitance current ic(k) and output voltage vo(k), or the feedback of capacitance current ic(k), and performs the constant current control to control the output voltage to follow the command voltage VREF. β3 is a factor that is provided to allow the output voltage to stably follow the command voltage VREF.

Table 2 below shows a relationship of signals in the mode1 to mode3 constant current control modes.

TABLE 2

| | Constant Current Control | 1st mode of Input signal | Command signal | Input signal | Factor, Constant |
|---|---|---|---|---|---|
| mode 1 | Capacitor Current | ic<br>ic-$_{REF}$<br>vo(k) | Ic-$_{REF}$ | Vin<br>ic(k)<br>Vo(k) | |
| mode 2 | Capacitor Current | ic-$_{REF}$<br>Vc1<br>β2 | β2 · Ic-$_{REF}$ | Vin | β2<br>Vc1 |
| mode 3 | Inductor Current | V-$_{REF}$<br>iv<br>Vo(k)<br>β3 | V-$_{REF}$ | ic(k)<br>(Vo(k)) | β3<br>Av |

(Settling to Command Voltage)

Figure 9:
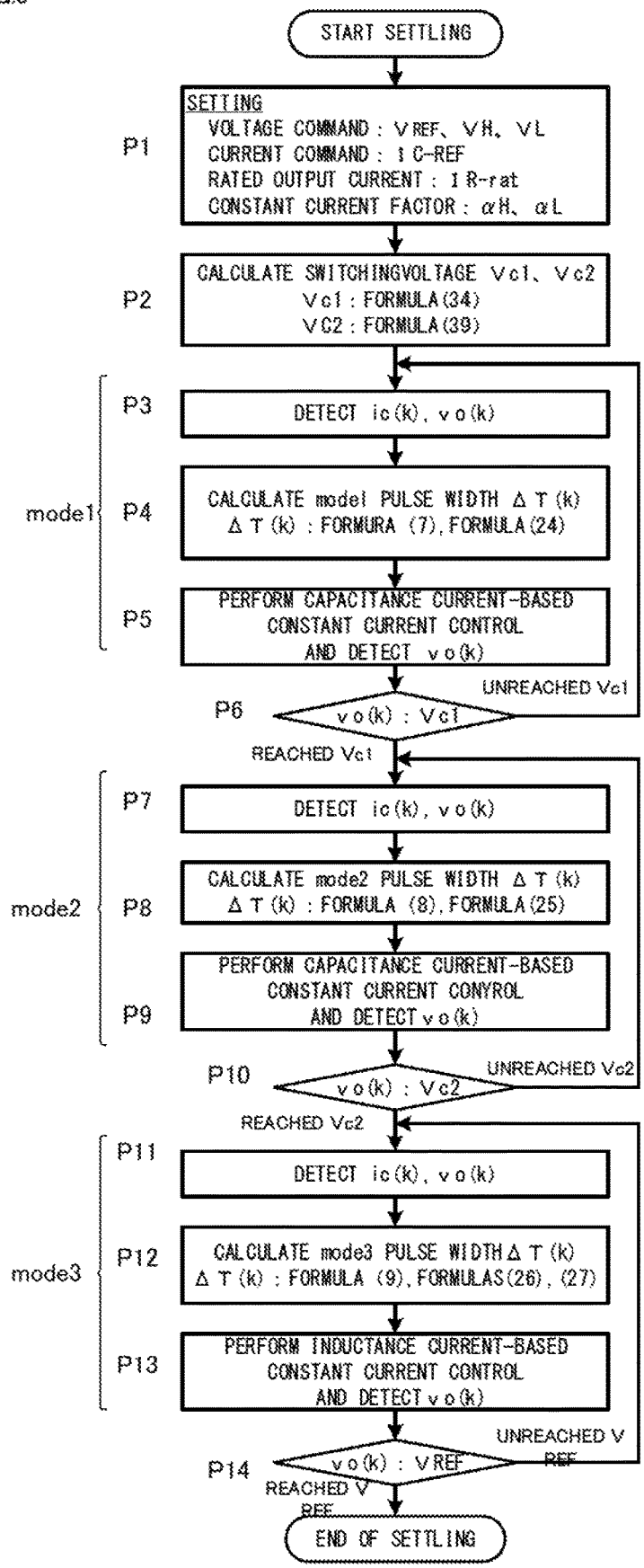
FIG. 9 is a flowchart showing output voltage settling to command voltage according to mode1 to mode3.

There will now be described a settling step to a command voltage, according to the aforementioned mode1 to mode3 steps, with reference to the flowchart as shown in FIG. 9. The flowchart in FIG. 9 shows each of the steps, with the reference symbols P1 to P14.

There are provided settings of command voltage VREF, command current IC-REF, rated output current IR-rat, and constant current factors αH and αL. In the case of High/Low two-level pulse power control, the command voltage of High level is indicated as VH, and the command voltage of Low level is indicated as VL. In addition, αH is a constant current factor of High level in the High/Low two-level pulse power control, and αL is a constant current factor of Low level in the High/Low two-level pulse power control (P1).

The switching voltage Vc1 from mode1 to mode1, and the switching voltage Vc2 from mode1 to mode3 are calculated. The switching voltages Vc1 and Vc2 are calculated according to the formulas 34 and 39 described later (P2).

(Steps of Mode1: P3 to P6)

Initially, the capacitance current-based constant current control is performed in the steps of mode1.

Values of ic(k) and vo(k) are detected (P3), and the pulse width ΔT(k) of mode1 is calculated. The pulse width ΔT(k) of mode1 is calculated according to formula 7 (formula 24). Formula 24 described below is identical to formula 7 (P4). On the basis of the pulse width ΔT(k) calculated in P4, the switching operation in the LC chopper circuit is controlled to perform the capacitance current-based constant current control, and then, the output voltage vo(k) is detected (P5).

It is determined whether thus detected output voltage vo(k) reaches the switching voltage vc1 calculated in P2 (P6). If the output voltage vo(k) has not reached the switching voltage vc1 yet, the steps from P3 to P5 are repeated, and when the output voltage vo(k) reaches the switching voltage vc1, the operation is shifted to the next mode2 step.

(Steps of Mode2: P7 to P10)

According to the steps of mode2, the capacitance current-based constant current control is performed.

Values of ic(k) and vo(k) are detected (P7), and the pulse width ΔT(k) of mode2 is calculated. The pulse width ΔT(k) of mode2 is calculated according to formula 8 (formula 25). Formula 25 described below is identical to formula 8 (P8). On the basis of the pulse width ΔT(k) calculated in P8, the switching operation in the LC chopper circuit is controlled to perform the capacitance current-based constant current control, and then, the output voltage vo(k) is detected (P9).

It is determined whether thus detected output voltage vo(k) has reached the switching voltage vc2 calculated by P2 (P10). If the output voltage vo(k) has not reached the switching voltage vc2 yet, the steps from P7 to P9 are repeated, and when the output voltage vo(k) reaches the switching voltage vc2, the operation is shifted to the next mode3 step.

(Steps of Mode3: P11 to P14)

According to the step of mode3, the inductance current-based constant current control is performed.

Values of ic(k) and vo(k) are detected (P11), and the pulse width ΔT(k) of mode3 is calculated. The pulse width ΔT(k) of mode3 is calculated according to formula 9 (formula 26, formula 28). Formula 26 described below is identical to formula 9 (P12). On the basis of the pulse width ΔT(k) calculated in P12, the switching operation in the LC chopper circuit is controlled to perform the inductance current-based constant current control, and then, the output voltage vo(k) is detected (P13).

It is determined whether or not thus detected output voltage vo(k) has reached the command voltage VREF that is provided in the step P1 (P14). If the output voltage vo(k) has not reached the command voltage VREF, the steps from P11 to P13 are repeated, and when the output voltage vo(k) has reached the command voltage VREF, settling to the command voltage VREF is completed. When next command voltage VREF is provided, the aforementioned steps from P1 to P14 are repeated for the settling of the output voltage vo to the command voltage VREF.

(Derivation of Pulse Width ΔT(k) (Derivation 1 to Derivation 9))

A configuration of the LC chopper circuit as shown in FIG. 10 is an example of two-way step-down chopper circuit according to the multi-phase interleaving system. In this step-down chopper circuit, wheeling diodes of diodes D1 to D3 employed in a general step-down chopper circuit are replaced by controllable elements to allow excessive energy in the output to regenerate on the input side, thereby achieving rapid control from full-load to no-load.

Here, three-phase interleaving is shown as an example of the multi-phase interleaving. Three switching circuits constituting the three-phase interleaving are provided, and the switching circuits are provided with switching elements Q1 to Q3 and diodes D1 to D3, respectively. In the phases of the three-phase interleaving, inductance L in the LC circuit 4 corresponds to inductances L in each of the three switching circuits, and inductance current values iL1 to iL3 of the respective inductances L are interleaved phase current values. In the multi-phase interleaving, the LC circuit 4 is provided with one capacitance C, and current obtained by subtracting the load current iR from the combined current (iL1+iL2+iL3) of the inductance current values iL1 to iL3 passes through the capacitance C.

Derivation of the pulse width ΔT(k) will be described in the following. Firstly, an initial stage of the derivation of the pulse width ΔT(k) will be described. On the preceding stage, in the constant current control for feeding back the combined current of multi-phase interleaving as the control current (derivation step 1), state equations of the two-way step-down chopper circuit of multi-phase interleaving system and of the pulse width ΔT(k) are obtained (derivation steps 2 and 3), and a function expression of the pulse width ΔT(k) is obtained on the basis of the state equations (derivation step 4).

Next, with the use of the function expression of the pulse width ΔT(k) obtained for the control current on the preceding stage, there will be described derivation of the pulse width ΔT(k) in the inductance current-based constant current control (derivation step 5), and derivation of the pulse width ΔT(k) in the capacitance current-based constant current control (derivation step 6).

Thereafter, there will be described derivation steps (derivation steps 7 to 9) for deriving the pulse width ΔT(k) of each of the control modes, mode1, mode2, and mode3, in the control mode where the step response is given by the multi-stage constant current control, including two-stage capacitance current-based constant current control, mode1 and mode2, and the subsequently performed constant current control of mode3.

Derivation Step 1:

There are derived formulas expressing the control current and output voltage in the constant current control that feeds back combined current as the constant current. FIG. 11 illustrates an equivalent circuit of the circuit as shown in FIG. 10, representing the equivalent circuit in a time domain sufficiently longer than the switching frequency, in the field of automatic closed-loop control response.

In the equivalent circuit as shown in FIG. 11, the combined current (iL1+iL2+iL3=iL) of phase current values of iL1, iL2, and iL3 of the respective phases is represented as a current source, and the combined inductance of the inductance L of each of the three switching circuits is represented as (L/3). In this equivalent circuit, the step response of the output voltage vo according to the input current (iL) received from the current source is expressed by:

$$v_O(s) = \frac{R}{1+sCR}\frac{i_L}{s} = Ri_L\left(\frac{1}{s} - \frac{1}{s+1/CR}\right) \quad (11)$$

$$v_O(t) = Ri_L(1 - e^{-\frac{1}{CR}t})$$

The formula 11 expresses that the step response of the output voltage vo exponentially increases to (R·iL) without inducing secondary oscillating voltage.

The time function iL(t) of the combined current of inductance current iL is defined by the following formula 12:

$$i_L(t) = i_C(t) + i_R(t) = A_V\{V_{REF} - v_O(t)\} + \beta i_C(t) + i_R(t) \quad (12)$$

The combined current (iL(t)), the capacitance current ic(t), and the output voltage vo(t) are expressed by the following formula 13:

$$i_L(t) = i_C(t) + i_R(t) = A_V\{V_{REF} - v_O(t)\} + \beta i_C(t) + i_R(t) \quad (13)$$

$$i_C(t) = \frac{A_V}{1-\beta}\{V_{REF} - v_O(t)\} = C\frac{d}{dt}v_O(t)$$

$$v_O(t) = V_{REF}\left\{1 - e^{-\frac{A_V}{(1-\beta)C}t}\right\}$$

The output voltage vo(t) in the formula 13 indicates that load resistance R is removed from the output voltage vo(t) expressed by the formula 11, and a final value after lapse of sufficient time (t→∞) converges into the command voltage VREF.

Therefore, by performing the constant current control using the combined current of inductance current iL(t) expressed by the formula 12 as the control current, the step response control can be performed without inducing the secondary oscillating voltage.

In the output voltage vo(t) as expressed by the formula 13, Av is a factor by which a difference value between the output voltage Vo(t) and the command voltage VREF (VREF−Vo(t)) is multiplied, β is a factor by which the capacitance current ic(t) is multiplied, defining followability characteristics to the command voltage VREF.

By way of example, as the factor Av approaches "1", the step response affected more strongly by the magnitude of the difference value (VREF−Vo(t)) is given, whereas the factor β approaches "1", the step response with higher followability to the command voltage VREF is given.

Derivation Step 2:

Next, the state equation of two-way step-down chopper circuit of the three-phase interleaving system is derived. FIG. 12 illustrates the equivalent circuit of one phase out of three phases. In order to convert the combined current (iL) expressed by the aforementioned formula 12 to a form as applicable to the constant current control, the state equation of iL (=iL1+iL2+iL3) being the combined current of iL1, iL2, and iL3 as shown in FIG. 10 is obtained, and a relational expression with the pulse width ΔT is derived.

According to the ON/OFF operations of Q1/D1 to Q3/D3 per phase in FIG. 10, Vin or 0 voltage is applied to U1(τ), U2(τ) and U3(τ). Using the principle of superposition, U1(τ) is represented by the equivalent circuit as shown in FIG. 12. In FIG. 12, U1(τ) is equal to Vin when Q1 is ON and D1 is OFF, whereas U1(τ) is equal to 0 when Q1 is OFF and D1 is ON.

In the state equation for the circuit of FIG. 10, a general solution of the state equation using U(τ) segmented with constant U(t) is expressed by the following formula 14:

$$\dot{x}(t) = Ax(t) \pm Bu(t)$$

$$x(t) = e^{At}x(0) + \int_0^t e^{A(t-\alpha)}d\sigma Bu(\tau) \quad (14)$$

The combined current i(t) can be derived from left multiplication of the general solution x(t) by the transformation matrix F corresponding to the circuit configuration as shown in FIG. 10.

$$i(t) = Fx(t) = Fe^{At}x(0) + F\int_0^t e^{A(t-\sigma)}d\sigma Bu(\tau) \quad (15)$$

where, $$x(t) = [i_{L1}(t)\ i_{L2}(t)\ i_{L3}(t)\ v_O(t)]^T \quad (16)$$

$$i(t) = [i_{L1}(t)\ i_{L2}(t)\ i_{L3}(t)]^T = Fx(t)$$

$$u(\tau) = [u_1(\tau)\ u_2(\tau)\ u_3(\tau)]^T$$

$$F = \begin{bmatrix} 1 & 0 & 0 & 0 \\ 0 & 1 & 0 & 0 \\ 0 & 0 & 1 & 0 \end{bmatrix},\ A = \begin{bmatrix} 0 & 0 & 0 & -1/L \\ 0 & 0 & 0 & -1/L \\ 0 & 0 & 0 & -1/L \\ 1/C & 1/C & 1/C & -1/CR \end{bmatrix},\ B = \frac{1}{L}\begin{bmatrix} 1 & 0 & 0 \\ 0 & 1 & 0 \\ 0 & 0 & 1 \\ 0 & 0 & 0 \end{bmatrix}$$

In order to obtain the aforementioned iL(t)=iL1(*t*)+iL2(*t*)+iL3(*t*) from i(t) described above, $GFe^{AT}$ is derived by using the transformation matrix G. In addition, FB and FAB are transformed as indicated by the following formulas:

$$\left. \begin{array}{l} i_L(t) = i_{L1}(t) + i_{L2}(t) + i_{L3}(t) = Gi(t) \\ G = [1\ 1\ 1],\ FB = \dfrac{1}{L}I_n,\ FAB = 0 \\ u_{01} = V_{in}[1\ 0\ 0]^T,\ u_{02} = V_{in}[0\ 1\ 0]^T,\ u_{03} = V_{in}[0\ 0\ 1]^T \\ u_{12} = V_{in}[1\ 1\ 0]^T,\ u_{13} = V_{in}[1\ 0\ 1]^T,\ u_{23} = V_{in}[0\ 1\ 1]^T,\ u_{123} = V_{in}[1\ 1\ 1]^T \\ e^{AT} = I_n + AT + \dfrac{(AT)^2}{2} \\ GFe^{AT} = \left(1 - \dfrac{3T^2}{2LC}\right)[1\ 1\ 1\ 0] + 3\left(-\dfrac{T}{L} + \dfrac{T^2}{2LCR}\right)[0\ 0\ 0\ 1] \end{array} \right\} \quad (17)$$

Derivation Step 3:

Next, the state equation of the pulse width ΔT(k) is derived.

There will now be obtained the relational expression of the pulse width ΔT(k), in the interval T of one cycle as shown FIG. 2(*a*). When i(T) is derived by applying the formulas 16 and 17 to the formula 15, the state equation expressed by the following formula 18 is obtained. Though not shown, i(T) for the interval T of one cycle as shown in each of FIGS. 2(*b*) and 2(*c*) is also expressed by the same formula as formula 18:

$$i(T) = Fe^{AT}x(0) + F\int_0^{t_1} e^{A(T-\sigma)} d\sigma Bu_{23} + \qquad (18)$$

$$F\int_{t_1}^{t_2} e^{A(T-\sigma)} d\sigma Bu_{123} + F\int_{t_2}^{t_3} e^{A(T-\sigma)} d\sigma Bu_{13} +$$

$$F\int_{t_3}^{t_4} e^{A(T-\sigma)} d\sigma Bu_{123} + F\int_{t_4}^{t_5} e^{A(T-\sigma)} d\sigma Bu_{12} +$$

$$F\int_{t_5}^{t_6} e^{A(T-\sigma)} d\sigma Bu_{123} + F\int_{t_6}^{t_7} e^{A(T-\sigma)} d\sigma Bu_{23}$$

$$i(T) = Fe^{AT}x(0) + \dfrac{1}{L}I_R$$

$$\{(T - \Delta T)(u_{23} + u_{13} + u_{12}) + (-2T + 3\Delta T)u_{123}\}$$

$$i(t) = Fe^{AT}x(0) + \dfrac{\Delta T}{L}I_R u_{123}$$

Derivation Step 4:

Next, a function expression of the pulse width ΔT(k) is derived.

When transforming the state equation of the pulse width ΔT(k) of formula 18 by using formula 17, following formula is obtained:

$$i_L(T) = Gi(T) = GFe^{AT}x(0) + G\dfrac{\Delta T}{L}I_n u_{123} \qquad (19)$$

$$i_L(T) = \left(1 - \dfrac{3T^2}{2LC}\right)i_L(0) + 3\left(\dfrac{T^2}{2LCR} - \dfrac{T}{L}\right)v_O(0) + \dfrac{3V_{in}(k)}{L}\Delta T$$

Assuming the load current iR(k) as iR(k)=vo(k)/R, and removing R from the aforementioned formula 19, the following formula 20 is obtained:

$$i_L(k+1) = \left(1 - \dfrac{3T^2}{2LC}\right)i_L(k) - \dfrac{3T}{L}v_O(k) + \dfrac{3T^2}{2LC}i_R(k) + \dfrac{3V_{in}(k)}{L}\Delta T(k) \qquad (20)$$

When the pulse width ΔT(k) is obtained from the aforementioned formula 20, following formula is obtained:

$$\Delta T(k) = \dfrac{1}{V_{in}(k)}\left\{\dfrac{L}{3}i_L(k+1) - \left(\dfrac{L}{3} - \dfrac{T^2}{2C}\right)i_L(k) + Tv_O(k) - \dfrac{T^2}{2C}i_R(k)\right\} \qquad (27)$$

The pulse width ΔT(k) as expressed by the aforementioned formula 21 indicates the pulse width ΔT(k) in the inductance current-based constant current control. Hereinafter, on the basis of the formula 21, there will be described the derivation of the pulse width ΔT(k) in the inductance current control (derivation step 5), and the derivation of pulse width ΔT(k) in the capacitance current control (derivation step 6).

Derivation Step 5:

Next, the pulse width ΔT(k) in the inductance current-based constant current control is derived.

For the pulse width ΔT(k) expressed by the formula 21, the function expression is used which is obtained by transforming the inductance current iL expressed as iL(k+1) in formula 12 into a discrete time form, whereby the pulse width ΔT(k) according to the inductance current-based constant current control can be obtained. Here, β shown in formula 12 is provided as β=β to be suitable for the mode3-inductance current-based constant current control.

$$\Delta T(k) = \dfrac{1}{V_{in}(k)}\dfrac{L}{3}\begin{bmatrix} A_V\{V_{REF} - v_O(k)\} + \beta_3 i_C(k) + i_R(k) - \\ \left(1 - \dfrac{3T^2}{2LC}\right)\{i_C(k) + i_R(k)\} + \\ \dfrac{3}{L}Tv_O(k) - \dfrac{3T^2}{2LC}i_R(k) \end{bmatrix} \qquad (22)$$

$$= \dfrac{1}{V_{in}(k)}\dfrac{L}{3}\left[A_V V_{REF} - \left(1 - \beta_3 - \dfrac{3T^2}{2LC}\right)i_C(k) + \left(\dfrac{3}{L}T - A_V\right)v_O(k)\right]$$

The aforementioned pulse width ΔT(k) is expressed by using the capacitance current ic(k) and the output voltage vo(k), instead of the inductance current iL (k) in the inductance current-based constant current control. With the expression using the capacitance current ic(k) instead of the inductance current iL(k), the inductance current-based constant current control and the capacitance current-based constant current control can be performed by the feedback of common capacitance current ic(k).

Derivation Step 6:

Next, the pulse width ΔT(k) in the capacitance current-based constant current control is derived.

In the capacitance current-based constant current control, with the command current represented as IC-REF, there is provided a definition of iL(k+1)=IC-REF+iR(k).

In the pulse width ΔT(k) expressed by formula 21, by using iL (k+1)=IC-REF+iR (k), the pulse width ΔT(k) in the capacitance current-based constant current control is expressed by the following formula 23.

$$\Delta T(k) = \frac{1}{V_{in}(k)} \left\{ \frac{L}{3} \{I_{C\text{-}REF} + i_R(k)\} - \left(\frac{L}{3} - \frac{T^2}{2C}\right) \{i_C(k) + i_R(k)\} + Tv_O(k) - \frac{T^2}{2C} i_R(k) \right\} \qquad (23)$$

$$= \frac{\frac{L}{3} I_{C\text{-}REF} - \left(\frac{L}{3} - \frac{T^2}{2C}\right) i_C(k) + Tv_O(k)}{V_{in}(k)}$$

According to the aforementioned pulse width ΔT(k), since elements of the load current iR(k) and the inductance current iL(k) are excluded, the pulse width ΔT(k) can be obtained by the feedback of the capacitance current ic(k) and the output voltage vo(k) without feeding back the load current iR(k) or the inductance current iL(k).

Next, derivation of the pulse width ΔT(k) of capacitance current-based constant current control mode1 and mode1, and derivation of the pulse width ΔT(k) of inductance current-based constant current control mode3 will be described (Derivation step 7 to Derivation step 9).

Derivation Step 7:

Derivation of the pulse width ΔT(k) of the mode1 capacitance current-based constant current control will be described.

In mode1, the first stage of capacitance current-based constant current control is executed. With the command current represented as IC-REF in the first stage constant current control, inductance current iL(k+1) is defined as iL(k+1)=IC-REF+iR(k). By using the pulse width ΔT(k) in the constant current control using the control current as expressed by formula 21, the pulse width ΔT(k) of mode1 expressed by formula 24 can be obtained.

$$\Delta T(k) = \frac{1}{V_{in}(k)} \left\{ \frac{L}{3} \{I_{C\text{-}REF} + i_R(k)\} - \left(\frac{L}{3} - \frac{T^2}{2C}\right) \{i_C(k) + i_R(k)\} + Tv_O(k) - \frac{T^2}{2C} i_R(k) \right\} \qquad (24)$$

$$= \frac{\frac{L}{3} I_{C\text{-}REF} - \left(\frac{L}{3} - \frac{T^2}{2C}\right) i_C(k) + Tv_O(k)}{V_{in}(k)}$$

Since elements of the load current iR(k) and the inductance current iL(k) are excluded from the function expression of the pulse width ΔT(k) defining the mode1 control, feedback of the load current iR(k) and the inductance current iL(k) becomes unnecessary.

In the mode1-capacitance current-based constant current control, in order to prevent the output voltage vo(k) from overshooting the DC command voltage VREF within the mode1 period, the first stage mode1-capacitance current-based constant current control is terminated when the output voltage vo(k) reaches Vc1, and it is switched to the second stage mode1-capacitance current-based constant current control. Here, Vc1 indicates the output voltage at which mode1 is switched to mode1. In the two-level dead beat control, as the DC command voltage, High DC command voltage VH is defined, and Low DC command voltage VL is defined.

Derivation Step 8:

Next, derivation of the pulse width ΔT(k) in the mode2-capacitance current-based constant current control will be described.

The mode2 pulse width ΔT(k) is obtained by the following formula 25, by substituting vo(k)=Vc1 and iL(k+1)=β2·IC-REF+iR(k), into the general formula 21 of the pulse width ΔT(k):

$$\Delta T(k) = \qquad (25)$$

$$\frac{1}{V_{in}(k)} \left[ \frac{L}{3} \{\beta_2 I_{C\text{-}REF} + i_R(k)\} - \left(\frac{L}{3} - \frac{T^2}{2C}\right) \{I_{C\text{-}REF} + i_R(k)\} + TV_{C1} - \frac{T^2}{2C} i_R(k) \right] = \frac{\frac{L}{3} \beta_2 I_{C\text{-}REF} - \left(\frac{L}{3} - \frac{T^2}{2C}\right) I_{C\text{-}REF} + TV_{C1}}{V_{in}(k)}$$

The aforementioned formula 25 is expressed with excluding the elements of the load current iR(k) and the inductance current iL(k) in the function expression of ΔT(k) defining the mode2 control.

In order to achieve rapid response in the constant current control in the period of mode2, β2 is selected so that the output voltage can reach the final value Vc2 starting from the initial value Vc1, within one period from the output voltage vo(k) to vo(k+1), whereby mode1 can be completed within one sampling time.

Derivation Step 9:

Next, derivation of the pulse width ΔT(k) in the mode3-inductance current-based constant current control will be described.

The pulse width ΔT(k) in the mode3-inductance current-based constant current control is similar to the pulse width ΔT(k) in the inductance current-based constant current control described in the derivation step 5, and it is expressed by the following formula 26:

$$\Delta T(k) = \frac{1}{V_{in}(k)} \frac{L}{3} \begin{bmatrix} A_V\{V_{REF} - v_O(k)\} + \beta_3 i_C(k) + i_R(k) - \\ \left(1 - \frac{3T^2}{2LC}\right)\{i_C(k) + i_R(k)\} + \\ \frac{3}{L}Tv_O(k) - \frac{3T^2}{2LC}i_R(k) \end{bmatrix} \quad (26)$$

$$= \frac{1}{V_{in}(k)} \frac{L}{3} \left[ A_V V_{REF} - \left(1 - \beta_3 - \frac{3T^2}{2LC}\right)i_C(k) + \left(\frac{3}{L}T - A_V\right)v_O(k)\right]$$

In general, an AC current transformer for detecting AC signals can provide rapid response, whereas a commonly used detector for detecting DC signals is relatively slow in response.

The pulse width $\Delta T(k)$ expressed in the aforementioned formula detects the capacitance current ic(k) and the output voltage vo(k), and uses them as feedback signals. The capacitance current ic(k) allows rapid response according to the AC current transformer, but the response of the detector for detecting the output voltage vo(k) is relatively slow. In order to achieve rapid step response, it is necessary to obtain feedback signals rapidly, and for that purpose, rapid detection by the detector is desirable.

In light of this situation, there will be described the control where the detection of output voltage vo(k) of low-speed response is skipped, and only AC signals of capacitance current are detected rapidly, thereby achieving rapid response.

In the pulse width $\Delta T(k)$ as expressed by the aforementioned formula 26, Avis defined as having the relationship expressed by the following formula 27, thereby eliminating the influence of the output voltage vo(k):

$$Av = 3T/L \quad (27)$$

where T is sampling cycle, and L is inductance of the LC circuit as shown in FIG. 10.

By setting Av as having the relationship of the aforementioned formula 27, using the sampling cycle T and inductance L of the LC circuit, the pulse width $\Delta T(k)$ can be expressed by the following formula 28 without including the output voltage vo(k).

$$\Delta T(k) = \frac{V_{REF} - \left\{\frac{(1-\beta_3)L}{3T} - \frac{T}{2C}\right\}i_C(k)}{V_{in}(k)} T \quad (28)$$

The pulse width $\Delta T(k)$ expressed by formula 28 includes only the capacitance current ic(k) as the feedback signal. Since the AC current transformer for detecting the capacitance current ic(k) is capable of providing rapid response, the pulse width $\Delta T(k)$ can be obtained by the rapid response.

Accordingly, elements of the output voltage vo(k), the load current iR(k), and the inductance current iL(k) can be excluded from the function expression of the pulse width $\Delta T(k)$ that defines the mode3-inductance current-based constant current control. Here, $\beta 3$ is selected in a manner that allows obtainment of a control response following the DC command voltage VREF, in the constant current control using the inductance current iL(t).

(Derivation of Switching Voltage Vc1 and Vc2)

There will now be described derivation of the switching voltage Vc1 for switching from mode1 to mode2, and derivation of the switching voltage Vc2 for switching from mode2 to mode3.

Derivation of Switching Voltage Vc1

Here, in the two-level dead beat control, High DC command voltage VH and Low DC command voltage VL are defined as the DC command voltage VREF.

There will be described the derivation of the switching voltage Vc1, for the case where target voltage of the step response is High-level command voltage VH, and for the case where the target voltage of the step response is Low-level command voltage VL.

(Derivation of Vc1 for Mode1 in High-Level Pulse Control)

Assuming the High-level target voltage is VH, the rated output current is IR-rat, the constant current factor is $\alpha$H, and the initial value of output voltage is vo(0), there are established, the command voltage VREF=VH, the command current of capacitance current IC-REF=$\alpha$H·IR-rat, and the initial value of the output voltage vo(0)=VL.

The mode1-capacitance current-based constant current control corresponds to current control for constant-current charging of the capacitor, and the output voltage vo(1) to vo(n) at respective points are expressed by the following formula 29, where the sampling frequency is set to 1, 2, ... k, ... n, and more:

$$v_O(1) = \frac{T}{2C}I_{C\text{-}REF} + v_O(0) \quad (29)$$

$$v_O(2) = \frac{T}{C}I_{C\text{-}REF} + v_O(1)$$

$$V_O(k+1) = \frac{T}{C}I_{C\text{-}REF} + v_O(k)$$

$$v_O(n) = \frac{(n-0.5)T}{C}I_{C\text{-}REF} + v_O(0)$$

where k and n are positive integers.

The switching voltage Vc1 is provided for terminating mode1, preventing the output voltage vo(k) from overshooting the command voltage VREF (=VH) in the period of the mode1-capacitance current-based constant current control. When the output voltage vo(k) reaches the switching voltage Vc1, the first stage mode1-capacitance current-based constant current control is terminated, and switching to the second stage mode1-capacitance current-based constant current control is performed next.

In order to prevent the output voltage vo(n) from overshooting the High-level command voltage VH, it is necessary to satisfy the relational expressions in the following formula 30, in the equivalent circuit as shown in FIG. 11, according to the relationship between the energy accumulated in the capacitor and input/output energy:

$$\frac{1}{2} \times \frac{L}{3}I_{C\text{-}REF}^2 \leq \frac{1}{2}C\{V_H^2 - v_O^2(n)\} \quad (30)$$

$$v_O(n) \leq \sqrt{V_H^2 - \frac{L}{3C}I_{C\text{-}REF}^2}$$

When these relational expressions 30 are rewritten using the formula 29, the following formula relating to the sampling frequency n can be obtained, which prevents the output voltage vo(n) from overshooting the High-level command voltage VH:

$$\frac{(n-0.5)T}{C}I_{C\text{-}REF} + v_O(0) \leq \sqrt{V_H^2 - \frac{L}{3C}I_{C\text{-}REF}^2} \quad (31)$$

$$n \leq \frac{C}{T}\left\{\sqrt{\left(\frac{V_H}{I_{C\text{-}REF}}\right)^2 - \frac{L}{3C}} - \frac{v_O(0)}{I_{C\text{-}REF}}\right\} + 0.5$$

$$N = \text{Int}\left[\frac{C}{T}\left\{\sqrt{\left(\frac{V_H}{\alpha_H I_{R\text{-}rat}}\right)^2 - \frac{L}{3C}} - \frac{V_L}{\alpha_H I_{R\text{-}rat}}\right\} + 0.5\right]$$

Here, N represents a value of integer part of n. Therefore, if the sampling frequency is equal to N or less, the output voltage vo(N) may not overshoot the High-level command voltage VH.

Assuming the transition voltage for shifting from mode1 to mode1 as Vtrans, the output voltage vo(n) expressed by the formula 29 at the sampling frequency N that satisfies the condition of the aforementioned formula 31, may satisfy the following relationship, where VL is the initial voltage Vo(0) of the output voltage in the High/Low control.

$$\frac{(N-1.5)T}{C}\alpha_H I_{R\text{-}rat} + V_L < V_{trans} \leq \frac{(N-0.5)T}{C}\alpha_H I_{R\text{-}rat} + V_L \quad (32)$$

When the transition voltage Vtrans is selected by using the average of the lowest and highest values in the aforementioned relational expression 32, it is expressed by the following formula 33.

$$V_{trans} = \frac{(N-1)T}{C}\alpha_H I_{R\text{-}rat} + V_L \quad (33)$$

When the output voltage vo reaches Vc1, equal to higher than the transition voltage Vtrans that satisfies the formula 33, the control is shifted to mode2. Therefore, the switching voltage Vc1 in the mode1 in the High-level pulse control is expressed by the following formula 34:

$$V_{C1} = \frac{(N-0.5)T}{C}\alpha_H I_{R\text{-}rat} + V_L \quad (34)$$

(Derivation of Vc1 for Mode1 in Low Pulse Control)

There will now be described derivation of Vc1 for mode1 when Low pulse control is performed.

Assuming the Low-level target voltage is VL, the rated output current is IR-rat, the constant current factor is αL, and the initial value of the output voltage is vo(0), there are established command voltage VREF=VL, the command current of capacitance current IC-REF=−αL·IR-rat, and the initial value of the output voltage vo(0)=VH.

In order to prevent the Low-level output voltage vo from undershooting the target voltage VL, it is necessary to start control from vo(n) and to end the control at the VREF=VL in the formula 29, within the time tus. The time tus corresponds to the time needed until accomplishment of regeneration to the input voltage Vin in the OFF state of all Q1 to Q3 and D1 to D3 in FIG. 10, in other words, it is the time for the capacitance current is to start from IC-REF until becoming zero current. According to the relational expression of energy in the no load state, it is necessary to satisfy the relationship expressed by the following formula 35.

$$V_L = v_O(n) - \frac{I_{C\text{-}REF}}{2C}t_{US} \quad (35)$$

$$\frac{1}{2} \times \frac{L}{3}I_{C\text{-}REF}^2 \leq V_{in}\frac{I_{C\text{-}REF}}{2}t_{US} + \frac{1}{2}C\{v_O^2(n) - V_L^2\} \approx V_{in}\frac{I_{C\text{-}REF}}{2}t_{US} = CV_{in}\{v_O(n) - V_L\}$$

$$v_O(n) \geq \frac{LI_{C\text{-}REF}^2}{6CV_{in}} + V_L$$

When these relational expressions are rewritten by using the output voltage vo(n) in formula 29, the formula 36 that relates to the sampling frequency n can be obtained, which prevents the output voltage vo(n) from undershooting the Low-level command voltage VL.

$$n \leq \frac{C}{T}\left\{\frac{V_H - V_L}{\alpha_L I_{R\text{-}rat}} - \frac{L\alpha_L I_{R\text{-}rat}}{6CV_{in}}\right\} + 0.5 \quad (36)$$

$$N = \text{Int}\left[\frac{C}{T}\left\{\frac{V_H - V_L}{\alpha_L I_{R\text{-}rat}} - \frac{L\alpha_L I_{R\text{-}rat}}{6CV_{in}}\right\} + 0.5\right]$$

Here, N represents a value of integer part of n. If the sampling frequency is equal to N or less, the output voltage vo(N) may not undershoot the Low-level command voltage VL.

Assuming the transition voltage for shifting from mode1 to mode2 is Vtrans, the output voltage vo(n) expressed by the formula 29 satisfies the following relationship, at the sampling frequency N that satisfies the conditions of the aforementioned formula 36. Here, VL represents the initial voltage Vo(0) of the output voltage in the High/Low control.

$$V_H - \frac{(N-0.5)T}{C}\alpha_L I_{R\text{-}rat} \leq V_{trans} < V_H - \frac{(N-1.5)T}{C}\alpha_L I_{R\text{-}rat} \quad (37)$$

Here, using the average of the lowest and highest values of the aforementioned relational expression to select the transition voltage Vtrans, it is expressed by the following formula 38:

$$V_{trans} = V_H - \frac{(N-1)T}{C}\alpha_L I_{R\text{-}rat} \quad (38)$$

When the output voltage vo(n) reaches Vc1 equal to lower than the transition voltage Vtrans which satisfies the formula 38, the control is shifted to mode2. Therefore, the switching voltage Vc1 of mode1 in the Low-level pulse control is expressed by the following formula 39:

$$V_{C1} = V_H - \frac{(N-0.5)T}{C}\alpha_L I_{R\text{-}rat} \quad (39)$$

Derivation of the Switching Voltage Vc2

There will now be described the derivation of the switching voltage Vc2.

In mode2, the second-stage capacitance current-based constant current control is executed. This second stage mode2-constant current control is to connect the mode1-constant current control and the mode3-constant current control.

If the inductance current-based constant current control is executed over the entire interval of the step response, the output voltage vo(k) operates according to an exponential function as shown in the formula 13, and it is expressed by the following formula 40. Here, β in the capacitance current ic(t) is set as β=β3, using β3 of the mode3-inductance current-based constant current control.

$$v_O(t) = V_{REF}\left\{1 - e^{-\frac{A_V}{(1-\beta_3)C}t}\right\} \quad (40)$$

$$i_C(t) = C\frac{d}{dt}v_O(t) = \frac{A_V}{1-\beta_3}V_{REF}e^{-\frac{A_V}{(1-\beta_3)C}t}$$

The point of the mode2 being the final value agrees with the initial point of mode3, and assuming this point as t=t2, the output voltage vo and the capacitance current is are expressed by the following formula 41:

$$v_O(t_2) = V_{C2} = V_{REF} - V_{REF}e^{-\frac{A_V}{(1-\beta_3)C}t_2} = V_{REF} - \frac{i_{C2}(1-\beta_3)}{A_V} \quad (41)$$

$$i_C(t_2) = i_{C2} = \frac{A_V}{1-\beta_3}V_{REF}e^{-\frac{A_V}{(1-\beta_3)C}t_2} = \frac{A_V}{1-\beta_3}(V_{REF} - V_{C2})$$

Vc2 and ic2 are final values of mode2, and simultaneously, they are initial values of mode3. The switching voltage Vc2 of mode2 is expressed by the formula 42, by using ic2 in the formula 41.

$$V_{C2} = V_{C1} + \frac{I_{C\text{-}REF} + i_{C2}}{2C}T = \quad (42)$$

$$V_{C1} + \frac{I_{C\text{-}REF}T}{2C} + \frac{A_V T}{2C(1-\beta_3)}(V_{REF} - V_{C2})$$

$$V_{C2} = \frac{T}{2C(1-\beta_3) + A_V T}\left\{A_V V_{REF} + (1-\beta_3)\left(\frac{2CV_{C1}}{T} + I_{C\text{-}REF}\right)\right\}$$

where VREF=VH, or VREF=VL.
(Derivation of Factors β2 and β3)
Next, there will be described the derivation of the factors β2 and β3.
Derivation of the Factor β2:

The control mode of mode2 indicates a transfer mode for the transfer from mode1 to mode3 with a minimum occurrence of hunting, and in mode2, the initial values are Vc1 and ic1=IC-REF, and the final values are Vc2 and ic2.

Under these circumstances, in mode2, control is performed so that the final values of mode2 reach the values obtained by formula 41, and the capacitance current is controlled with the constant current β2·IC-REF, with the setting of β=β2. Here, β2 is a factor to adjust the command current IC-REF of the capacitance current in mode2.

In other words, the capacitance current ic(k+1) to reach the value obtained by the formula 41 at the time of (k+1) is expressed by the following formula 43:

$$i_C(k+1) = \beta_2 I_{C\text{-}REF} = i_{C2} \quad (43)$$

The factor β2 can be obtained by substituting the formula 41 into the formula 43.

$$\beta_2 = \frac{A_V}{1-\beta_3}\frac{V_{REF} - V_{C2}}{I_{C\text{-}REF}} \quad (44)$$

By setting the factor β2 according to the formula 44, the capacitance current ic can be set as ic2 for the switching time of mode1.

Derivation of Factor β3:

There will be described the derivation of β3 in the mode3 control. β3 is a factor of the capacitance current ic, and it is selected in a manner that allows obtainment of the control response following the DC command voltage VREF, in the constant current control using inductance current iL(t).

The factor β3 is selected in a manner that allows obtainment of the control response following the command voltage VREF in the constant current control using inductance-current iL expressed by the formula 12. This selection of factor β3 is performed according to stability determination in an automatic control system of mode3. Selection of the factor β3 will be described in the following.

(Closed-Loop First Order Transfer Function of Constant Voltage Control)

Firstly, there will be described a closed-loop first order transfer function of the constant voltage control.

When the inductance current iL(t) expressed by the formula 12 is represented by S-function with the setting of β=β3, it is expressed by the following formula 45:

$$i_C(s) = \frac{A_V\{V_{REF} - v_O(s)\}}{1-\beta_3} \quad (45)$$

Figure 13:
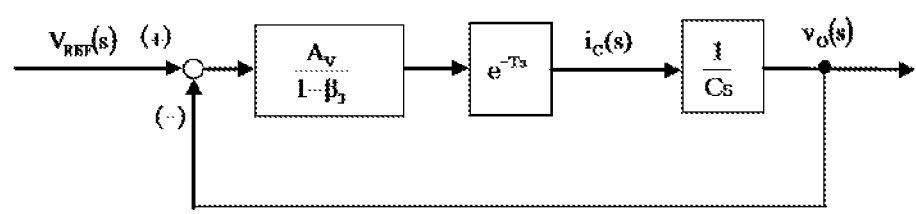
FIG. 13 illustrates a first order transfer function of the constant voltage control.

FIG. 13 illustrates a circuit block of the closed-loop transfer function as expressed by the aforementioned formula 45, showing the circuit state according to the first order transfer function of the constant voltage control. In the circuit block of the closed-loop transfer function as shown in FIG. 13, control response frequency ωc indicates the point where gain of a loop transfer function reaches "1". The control response frequency ωc that allows the gain of the loop transfer function to reach "1" in FIG. 13 can be obtained according to the following formula 46, by substitution of Av of the formula 27.

$$\omega_c = \frac{A_V}{(1-\beta_3)C} = \frac{3T}{(1-\beta_3)LC} = \frac{\omega_n^2 T}{1-\beta_3} \quad (46)$$

$$\omega_n = \sqrt{\frac{3}{LC}}$$

The aforementioned formula 46 indicates that the control response frequency ωc is selected based on β3, however, the control response frequency ωc to obtain the gain "1" may be affected by the parameters ωn and T, in addition to β3, and therefore there are restrictions in selecting β3. In light of this situation, a selection range is defined to select the value of β3.

(Closed-Loop Second Order Transfer Function and β3 Selection Range)

Next, there will be described the closed-loop second order transfer function and β3 selection range.

The formula 28 related to the pulse width ΔT(k) of mode3 is modified and expressed by a continuous function. Then, the following formula 47 is obtained:

$$V_{in}(t)\frac{\Delta T(t)}{T} = V_{REF} - \left\{\frac{(1-\beta_3)L}{3T} - \frac{T}{2C}\right\}i_C(t) = \quad (47)$$

$$V_{REF} - \left\{\frac{(1-\beta_3)}{A_v} - \frac{T}{2C}\right\}i_C(t)$$

The left side member Vin(t)ΔT(t)/T of the aforementioned formula 47 represents a mean value of the output voltage vo(t). In other words, in the circuit as shown in FIG. 10, it corresponds to an average of the voltage across D1, the voltage across D2, and the voltage across D3.

Figure 19:
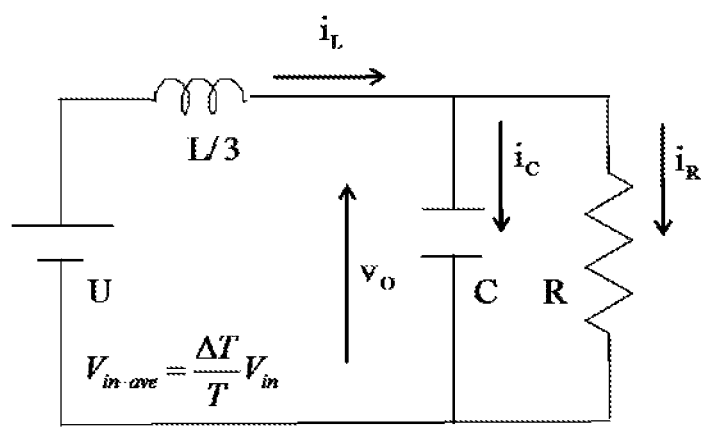
FIG. 19 illustrates the constant voltage control for feedback of the output voltage vo.

Therefore, vo(s) representing vo(t) by S-function is expressed as the following, where U=Vin(s)ΔT(s)/T, using the circuit configuration of FIG. 19, $$v_O(s) = \frac{\omega_n^2}{s^2 + 2\varsigma\omega_n s + \omega_n^2}\frac{\Delta T(s)}{T}V_{in}(s) = \quad (48)$$

$$\frac{\omega_n^2}{s^2 + 2\varsigma\omega_n s + \omega_n^2}\left[V_{REF}(s) - \left\{\frac{(1-\beta_3)}{A_v} - \frac{T}{2C}\right\}i_C(s)\right]$$

$$\omega_R = \sqrt{\frac{3}{LC}}, \varsigma = \frac{1}{2R}\sqrt{\frac{L}{3C}}$$

Figure 14:
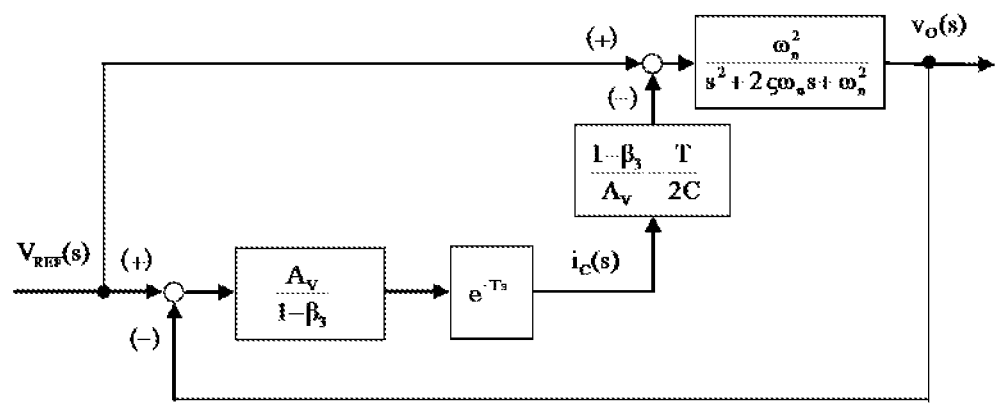
FIG. 14 illustrates a second order transfer function of the constant voltage control.

Accordingly, the second order transfer function vo(s)/VREF(s) is illustrated by FIGS. 13 and 14. FIG. 14 shows a circuit state of the second order transfer function of the constant voltage control. The loop transfer function of vo(s) in FIG. 14 is expressed by the following formula 49:

$$\frac{A_V}{1-\beta}|e^{-Ts}|\left(\frac{1-\beta_3}{A_V} - \frac{T}{2C}\right)\left|\frac{\omega_n^2}{s^2 + 2\varsigma\omega_n s + \omega_n^2}\right| = \quad (49)$$

$$\left\{1 - \frac{A_V T}{2(1-\beta_3)C}\right\}\left|\frac{\omega_n^2}{s^2 + 2\varsigma\omega_n s + \omega_n^2}\right||e^{-Ts}|$$

Since this transfer function indicates positive feedback, the gain in the control response should be selected as "1" or less, so as to avoid oscillation. According to this restriction imposed on the gain, the following conditional expression 50 is obtained:

$$\left\{1 - \frac{A_V T}{2(1-\beta_3)C}\right\}\left|\frac{\omega_n^2}{(j\omega_C)^2 + 2\varsigma\omega_n j\omega_C + \omega_n^2}\right| < 1 \quad (50)$$

In this conditional expression 50, assuming the factor represented by word-final sigma as zero, there will be considered the case where the stability condition becomes the worst. Substitution of the formula 46 into this conditional expression yields the following formula 51:

$$\left\{1 - \frac{\omega_c T}{2}\right\}\left|\frac{\omega_n^2}{-(\omega_C^2 - \omega_n^2)}\right| = \left(1 - \frac{\omega_c T}{2}\right)\frac{\omega_n^2}{\omega_C^2 - \omega_n^2} < 1 \quad (51)$$

$$\omega_C > \omega_n\left\{\sqrt{2 + \left(\frac{\omega_n T}{4}\right)^2} - \frac{\omega_n T}{4}\right\}$$

In determining the stability, the control response frequency ωc is restricted by the aforementioned conditional expression, and in addition, impact imposed by dead time in the switching time T will be considered.

The dead time is expressed by exp(−jωcT)=cos(ωcT)−j cos(ωcT). Therefore, the range of ωc is defined as ωc<π/(2T), which permits the phase margin of the loop transfer function of vo(s) as shown in FIG. 13 is up to 0 [deg], that is, ωcT=π/2.

By using the formula 46, the range of (1-β3) is expressed by the following formula 52:

$$1 - \beta_3 > \frac{2\omega_n^2 T^2}{\pi} \quad (52)$$

The range of (1-β3) including formula 51 is expressed by the formula 53, and this allows selection of the factor β3:

$$\frac{2\omega_n^2 T^2}{\pi} < 1 - \beta_3 < \frac{\omega_n T}{\sqrt{2 + \left(\frac{\omega_n T}{4}\right)^2} - \frac{\omega_n T}{4}} \quad (53)$$

In the constant current control using the inductance current iL(t), the factor β3 is selected from the range as described above, and the gain is reduced to be equal to or less than "1", allowing the control response to stably follow the DC command voltage VREF.

(Detection of Output Voltage Vo(t))

There will now be described rapid detection of the output voltage vo(t).

In order to perform control with high switching frequency, it is necessary to detect the output voltage vo(t) and the capacitance current ic(t) rapidly. In the pulse control including two levels of High/Low, in particular, in the mode1 and mode1 capacitance current-based constant current control, detectors for detecting the output voltage vo(t) and the capacitance current ic(t) are required to perform rapid measurement.

In order to detect the output voltage vo(t) rapidly, detection signal Vo-slow is used as an initial value vo(0), which is detected by a detection means with relatively slow response characteristics like a commonly-used sensor. Then, the initial value vo(0) and the capacitance current ic(t) are subjected to rapid discrete time process, and then the output voltage vo(t) is obtained. In acquiring the output voltage vo(t), the detection signal Vo-slow detected by the detection means with the relatively slow response characteristics, is set as the initial value vo(0). However, only the initial value vo(0) is a detection target by the detection means, and the output voltage vo(t) at each point of time can be computed, without using the detection means that is slow in the response speed. Accordingly, this allows rapid detection.

In mode3, the output voltage vo(t) at each point t can be obtained without usage as a feedback signal, and thus, there is no impact of disturbance due to vo-slow. Therefore, vo-slow is provided in the settling interval in mode3. In the mode1 to mode3 constant current control performed in each sampling cycle, the final value vo-slow of mode3 in the previous sampling cycle, is used as the initial value vo(0) for obtaining vo(t) to be used in mode1 and mode1 in the subsequent sampling cycle.

In the step-down chopper circuit example of the three-phase interleaving system as shown in FIG. 1, the sampling time T is set as T=1/Fs, where Fs is the switching frequency.

In order to detect the output voltage vo(t) rapidly, sampling time Th is provided, sufficiently shorter than the sampling time T, satisfying Th<0.1·(T/3).

In this sampling time Th, capacitance current ic(t) is detected by an AC transformer that allows rapid detection easily, and then, following discrete time process is performed thereon. Here, Th is defined as Th=tm−tm−1.

$$V_{O\text{-}det}(k_m) = \frac{1}{C} \int_{t_{m-1}}^{t_m} i_C(t)dt + V_{O\text{-}det}(k_m - 1) \quad (54)$$

$$V_{O\text{-}det}(k_m) = \frac{i_C(k_m - 1)}{C} T_h + V_{O\text{-}det}(k_m - 1)$$

In the two-level pulse control where two-level High/Low pulse operation is performed in wideband (1 Hz to 50 Hz), after the settling of the Low (High) level, the next output voltage is used as an initial value voltage of High (Low) of the next High/Low two-level pulse operation.

After settling of the Low level pulse operation, the High level pulse operation starts from the output voltage VL. If the output voltage reaches VH after the settling, the following formula 55 is established:

$$\begin{aligned} v_O(1) &= \frac{i_C(0)}{C} T_h + v_O(0) \\ v_O(2) &= \frac{i_C(1)}{C} T_h + v_O(1) \\ v_O(3) &= \frac{i_C(2)}{C} T_h + v_O(2) \\ v_O(k_m) &= \frac{i_C(k_m - 1)}{C} T_h + v_O(k_m - 1) \end{aligned} \quad (55)$$

In formula 55 above, the detection signal vo-slow obtained by the detection means like a commonly-used sensor, with relatively slow response, can be used as the initial value vo(0) corresponding to VL.

The control of mode3 still continues even after the output voltage vo(km) reaches the set voltage VH-set. Assuming the VH-set arrival time as Tset, the relationship as the following is established between the sampling frequency km and Tset in mode1 and mode1 and Tset:

$$km \cdot Th > Tset$$

$$km > Tset/Th$$

In practical applications, in the case where Tset=8 μs and Th=1/60 MHz, km>8 μs×60 MHz=480. In this example, resolution of 480 or higher can be obtained, and the detection speed is Th=1/60 MHz=0.0167 μs.

Similarly, Low level pulse operation starts from voltage VH after the settling of the High level pulse operation, and when reaching the voltage VL after the settling, it becomes possible to use the detection signal vo-slow as vo(0) corresponding to VH, which is obtained through detection by the commonly-used sensor relatively slow in response. The control of mode3 still continues even after vo(km) reaches the set voltage VL-set.

The power supply device of the present invention is applicable to a double control system of two-level dead beat control, including a main loop that follows a command signal from the power supply device, and a minor loop that follows High/Low DC command voltage of the two-way step-down chopper circuit of the multi-phase interleaving system, and this invention is applicable to devices such as a DC power supply device, an AC power supply device including an UPS, and an RF generator.

With reference to FIG. 15, an example where the power supply device of the present invention is applied to the RF generator will be described, an operation example will be described when the power supply device of the present invention is applied to the RF generator with reference to the flowchart of FIG. 16, and with reference to the flowchart of FIG. 17, a High/Low control example will be described. In addition, with reference to FIG. 18, there will be described an example where the power supply device of the present invention is applied to a DC power supply device and to an AC power supply device.

(Application Example of RF Generator)

FIG. 15 is a control block diagram illustrating a control system as an application example of the RF generator. The control system comprises PI control constituting a main loop control system, and a dead beat control constituting the minor loop control system. Here, two-level dead beat control system of the power supply device according to the present invention is applied to the dead beat control constituting the minor loop control system. This two-level dead beat control system is configured to follow High/Low DC command voltage in the two-way step-down chopper circuit of multi-phase interleaving system.

When performing the two-level control of High-level and Low-level, in the main loop, High-level forward wave power command PH-Forward, or High-level load power command PH-Load is used as a High-level command signal, and Low-level forward wave power command PL-Forward, or Low-level load power command PL-Load is used as a Low-level command signal. Then, the PI control is performed by feeding back the High-level forward wave power or the Low-level forward wave power, or the High-level load power or the Low-level load power, acquired from the load side. As rated values, rated DC voltage Vo-rat, rated DC current Io-rat, and rated forward wave power Ph-rat are inputted.

On the other hand, in the minor loop, the High-level command voltage VH and the Low-level command voltage VL obtained by the PI control are set as command values, and the dead beat control is performed by feeding back the output voltage vo or the capacitance current ic.

Figure 16:
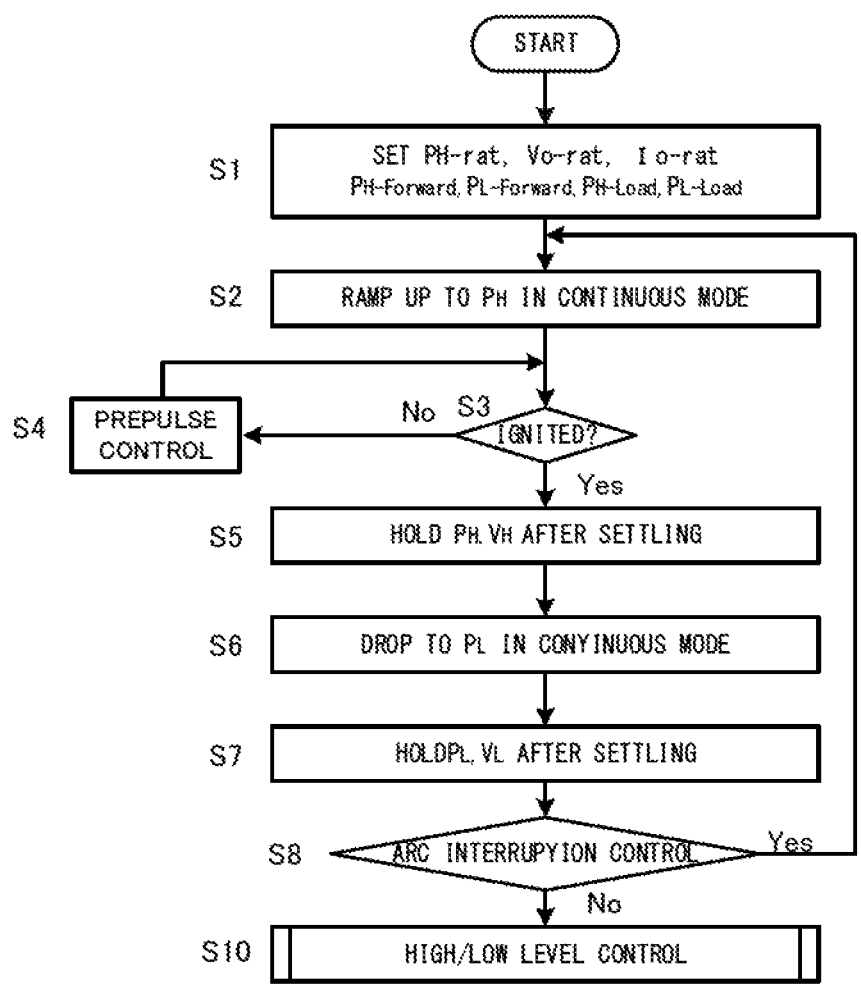
FIG. 16 is a flowchart showing an example for controlling the RF generator to which the power supply device of the present invention is applied.
Figure 17:
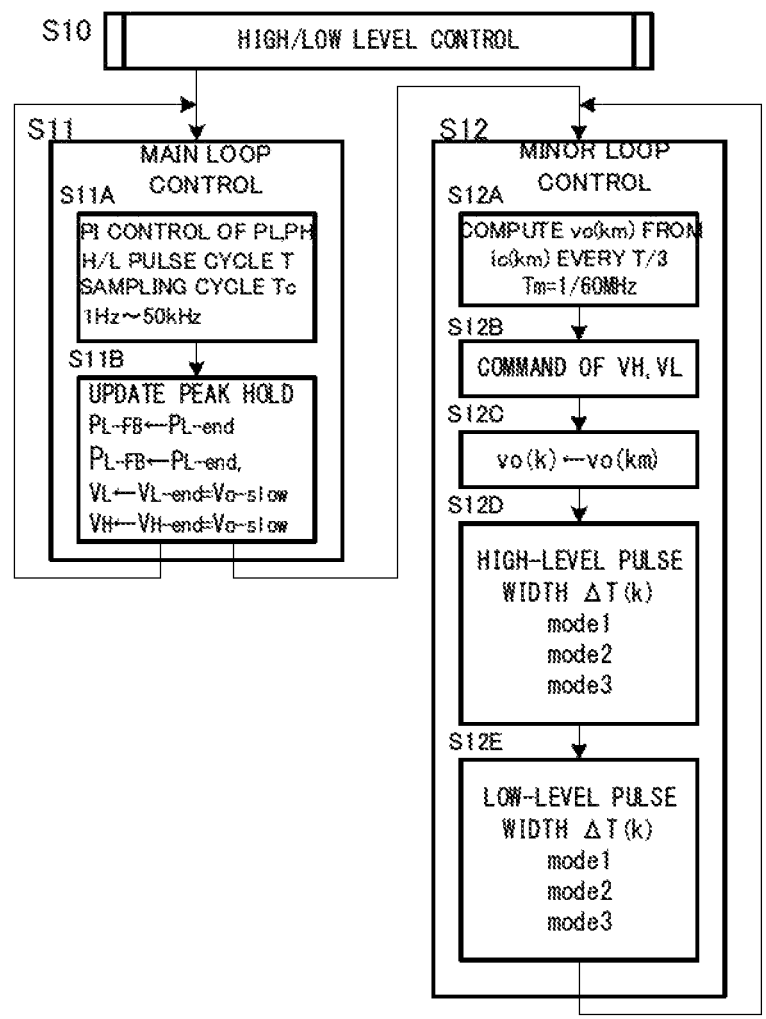
FIG. 17 is a flowchart showing an example of High/Low control in equipment to which power supply device of the present invention is applied.

The flowchart in FIG. 16 shows a startup mode for the RF generator to ignite plasma in a plasma load. In the flowcharts as shown in FIGS. 16 and 17, steps are labeled with the reference symbols such as S1 to S10, and S11 and S12, respectively.

There are provided rated values of the RF generator, and command values for driving the RF generator. As the rated values, rated DC voltage Vo-rat, rated DC current Io-rat, and rated forward wave power PH-rat are provided and they are inputted to set the rated values. In addition, as a High-level power command PH, the High-level forward wave power command PH-Forward, or the High-level load power command PH-Load is inputted, and as a Low-level power command PL, the Low-level forward wave power command PL-Forward or the Low-level load power command PL-Load is provided (S1).

Initially, ramp-up operation is performed with continuous mode up to the High-level power command PH, for example, in 20 ms (Ramp Up (PH-rat/20 ms)) (S2).

If plasma is not ignited according to voltage rise with the continuous mode (S3), igniting operation is performed according to prepulse control. The prepulse control is to apply more than one prepulse with a pulse width narrower than a main pulse, thereby forming an atmosphere of plasma ignition, as a preceding stage prior to applying the main pulse that induces plasma ignition. Patent Document 4 discloses this prepulse control.

In the prepulse control, according to the duty control at 5 kHz, for example, supplied power is raised to PH, with maintaining the average reflected power PREF-ave to a predetermined value. The predetermined value of the average reflected power PREF-ave is defined by multiplying the High-level rated power PH-rat by a predetermined factor, for instance. By way of example, 0.1 may be set as the predetermined factor. A pulse under ON/OFF control at a duty ratio of 10% may be used as this average reflected power PREF-ave of the prepulse mode.

A patterned operation of the prepulse mode is repeated, and when the repetitive operation count reaches a prescribed number of times, failure of ignition is displayed, and the operation is suspended (S4).

When plasma is ignited (S3), a High-level voltage value VH is reserved, which starts from the High-level power command PH set at High level and after settling to the High-level power command PH (S5).

Then, according to ramp down operation (Ramp Down (PH-rat/20 ms)), dropping from the High-level power command PH to the Low-level power command PL is performed (S6), the Low-level voltage value VL after the settling to the Low-level power command PL is reserved (S7). Accordingly, High-level command voltage VH after the settling can be set as the High-level command voltage VREF (High), that is, VREF(High)=VH, and the Low-level command voltage VL after the settling can be set as the Low-level command voltage VREF (Low), that is, VREF(Low)=VL.

Thereafter, if arc is generated, after suspending the power supply by arc interruption control, the ignition operations from S2 to S7 are performed (S8), whereas if arc interruption control is not performed, the High/Low two-level control is performed (S10).

(High/Low-Level Control)

Next, with reference to the flowchart of FIG. 17, an example of the High/Low-level control will be described. In the flowchart of FIG. 17, the High/Low-level control includes, the PI control according to the main loop (S11) where output power is made to follow the power command of the forward wave power PH(Forward)/PL(Forward), or the power command of load power PH (Load)/PL (Load), and the dead beat control according to the minor loop (S12) where the output voltage is made to follow the High/Low two-level command voltage.

In the PI control using PH and PL according to the main loop of S11, processing is performed in a sampling cycle Tc slower than the sampling cycle T in which the dead beat control of the minor loop is performed (S11A). For example, the sampling cycle Tc may be 50 µs, and the H/L pulse cycle may be set to 1 Hz to 50 kHz.

In the minor loop control (S12) performed during the process of PI control of S11A, if it is performed according to three-phase interleaving, for example, the output voltage vo(km) using the sampling cycle Th is computed according to the following formula 56 included in the formula (55):

$$vo(km)=(ic(km-1)/C)\cdot Th+vo(km-1) \tag{56}$$

As to each phase in the three-phase interleaving, vo(km) obtained in every T/3, being one-third of the sampling cycle T, is detected as the output voltage vo(k). Here, km represents resolution, and km >Tset/Th=[[881]] 8 µs ×60 MHz=480 in the case where Tset=8 µs and Th=1/60 MHz, for example. hi this example, the resolution of 480 or higher can be obtained (S12A).

Then, the High-level command voltage VH and the Low-level command voltage VL are acquired (S12B), and each of vo(km) at k point after the settling is acquired as the High-level output voltage vo(k) and as the Low-level output voltage vo(k) (S12C).

The High-level pulse width $\Delta T(k)$ is obtained (S12D), and by using thus obtained pulse width $\Delta T$ the output voltage vo is controlled to follow the High-level command voltage VH. Next, the Low-level pulse width $\Delta T(k)$ is obtained (S12E), and by using thus obtained pulse width $\Delta T(k)$, the output voltage vo is controlled to follow the Low-level command voltage VL.

Starting from the control to follow the High-level power command PH, the control to follow the Low-level power command PL is performed next. The High-level PH control and the Low-level PL control are repeated, and operation of the High/Low pulse power control continues.

Every time each High/Low pulse power control is finished, peak holding is performed to hold data of; High-level end power PH-end and Low-level end power PL-end, and High-level end voltage VH-end and Low-level end voltage VL-end.

The High-level end voltage VH-end and Low-level end voltage VL-end are held as the command voltage VH and VL, the command voltage VREF in the formula 12 in association with the High/Low levels, respectively. In addition, the High-level end power PH-end and the Low-level end power PL-end are used as feedback signals of High/Low pulses.

(Application Examples of DC Power Supply Device and AC Power Supply Device)

Next, with reference to FIG. 18, there will be described the examples where the power supply device of the present invention is applied to a DC power supply device and to an AC power supply device.

Figure 18:
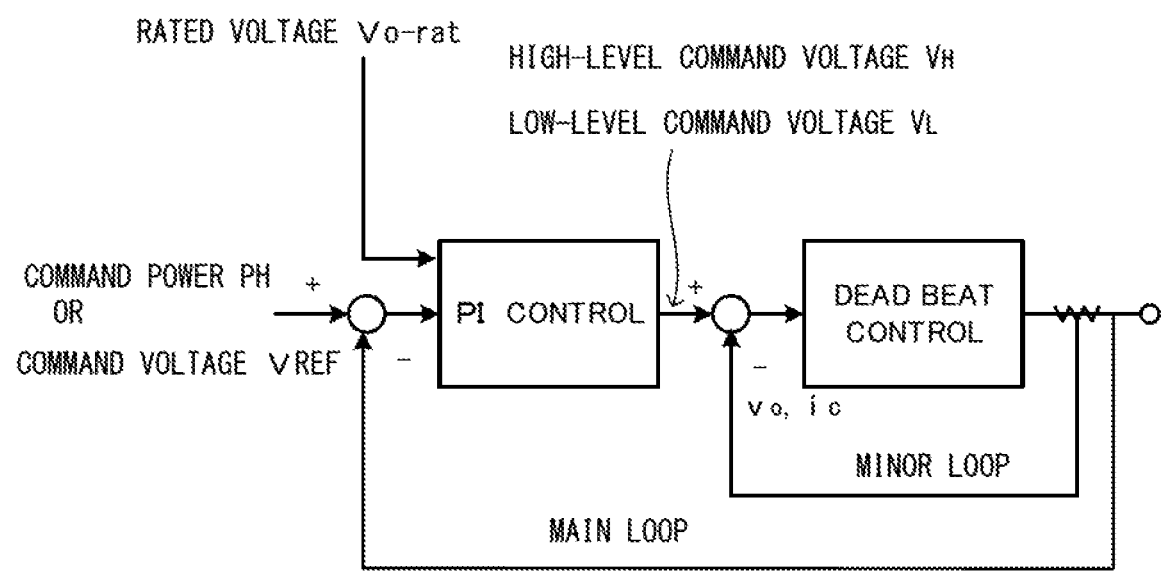
FIG. 18 illustrates a control example of a DC power supply device and an AC power supply device to which the power supply device of the present invention is applied.

FIG. 18 is a control block diagram illustrating a control system of the application example where the power supply device of the present invention is applied to the DC power supply device and to the AC power supply device. The control system comprises the PI control constituting the main loop control system, and the dead beat control constituting the minor loop control system. The two-level dead beat control system of the power supply device according to the present invention is applied to the dead beat control constituting the minor loop control. The two-level dead beat control system follows High/Low DC command voltage of the two-way step-down chopper circuit in the multi-phase interleaving system.

When two-level control; High-level and Low-level, is performed, High-level power command PH or High-level voltage command VrefH, and Low-level power command PL or Low-level voltage command VrefL, are used as command signals in the main loop, and power or voltage acquired from the load side is fed back, whereby PI control is performed. As rated values, rated DC voltage Vo-rat, rated DC current Io-rat, and rated forward wave power PH-rat are inputted.

On the other hand, in the minor loop, High-level command voltage VH and Low-level command voltage VL obtained by the PI control are used as command values, the dead beat control is performed by feeding back the output voltage vo or capacitance current ic.

The embodiments and modifications described above are just examples of the power supply device of the present invention. Therefore, it is to be understood that the present invention is not limited to each of those embodiments, but it may be variously modified on the basis of the spirit of the present invention, and such modifications are not excluded from the scope of the invention.

INDUSTRIAL APPLICABILITY

The power supply device of the present invention may be applicable to supplying of RF power, to devices utilizing radio frequency, such as equipment for manufacturing a semiconductor, a liquid crystal panel, or the like, vacuum deposition equipment, and heating and melting equipment.

DESCRIPTION OF SYMBOLS 1 power supply
2 chopper circuit
3 switching circuit
4 LC circuit
5 switching signal generator
6 controller
7 load
Av, β factor
C capacitance
D1-D3 diode
F transformation matrix
G transformation matrix
IC-REF command current of capacitance current
IR-rat rated output current
Io-rat rated DC current
ic capacitance current
iL inductance current
iL1-iLn inductance current
iR load current
L inductance
N sampling frequency
PH High-level power command
PH-Forward High-level forward wave power command
PH-Load High-level load power command
PH-end High-level end power
PH-rat High-level rated power
PL Low-level power command
PL-Forward Low-level forward wave power command
PL-Load Low-level load power command
PL-end Low-level end power
PREF-ave average reflected power
Q1-Q3 switching element
R load
T sampling cycle
Th sampling time
Tc sampling cycle
V input voltage
Vc1 switching voltage
Vc2 switching voltage
VH High-level command voltage
VH-end High-level end voltage
VH-set High-level set voltage
VL Low-level command voltage
VL-end Low-level end voltage
VREF command voltage
Vin input voltage
V1 set voltage
vo output voltage
Vo-rat rated DC voltage
Vo-slow detection signal
Vtrans transition voltage
km sampling frequency
vo output voltage
$\Delta T(k)$ pulse width

What is claimed is:

1. A power supply device of multi-phase interleaving control for performing multi-phase control using a plurality of phase current values, comprising, an LC chopper circuit constituting a step-down chopper circuit that operates according to the multi-phase control of multi-phase interleaving, and a controller configured to perform a step response control according to the multi-phase control of the LC chopper circuit, wherein, the controller performs the step response control according to the multi-phase control by a discrete time process, allowing output voltage to follow a command voltage based on switching control per phase of an LC circuit according to constant current control using as control current, combined current of respective phase current values in the LC chopper circuit, and the output voltage is an operation result of the discrete time process, using an initial value of the output voltage at a predetermined point, and detection values of capacitance current at respective points in the discrete time process.

2. A method for controlling a power supply device including an LC chopper circuit, the method controlling the power supply device of multi-phase interleaving control for performing multi-phase control according to a plurality of phase current values, wherein, in a step response control according to the multi-phase control where switching per phase in an LC circuit is performed by a discrete time process according to constant current control using combined value of respective phase current values in the LC chopper circuit as control current, allowing output voltage to follow command voltage, an initial discrete time process for the step response control allows acquisition of the output voltage, by an operation of the discrete time process using an initial value of the output voltage at a predetermined point and a detection value of capacitance current obtained at a point of the discrete time process in a present operation cycle, and in the respective operation cycles of the discrete time process for the step response control subsequently performed, the output voltage in each of the operation cycles is acquired by repeating the operation of the discrete time process using the operation result of a previous operation cycle, and the detection value of the capacitance current obtained at the point in the present operation cycle.

3. The method for controlling the power supply device according to claim 2, wherein,
   the predetermined point is a start point for stating the step response control, and
   the initial value is the output voltage detected at the start point.

4. The method for controlling the power supply device according to claim 2, wherein,
   the step response control is two-level pulse power control providing High-level command voltage and Low-level command voltage alternately,
   the predetermined point is an initial start point of the step response control and an end point of the pulse power control of each level,
   the output voltage detected at the initial start point of the step response control is an initial value for acquiring the output voltage of initial pulse power control, and
   the output voltage detected at the end point of the pulse power control of each level is an initial value for acquiring the output voltage in the pulse power control of the level subsequent to the pulse power control of the present level.

* * * * *